United States Patent
Chowdhury et al.

(10) Patent No.: US 10,418,475 B2
(45) Date of Patent: Sep. 17, 2019

(54) DIAMOND BASED CURRENT APERTURE VERTICAL TRANSISTOR AND METHODS OF MAKING AND USING THE SAME

(71) Applicants: ARIZONA BOARD OF REGENTS ON BEHALF OF ARIZONA STATE UNIVERSITY, Scottsdale, AZ (US); THE REGENTS OF THE UNIVERSITY OF CALIFORNIA, Oakland, CA (US)

(72) Inventors: Srabanti Chowdhury, San Ramon, CA (US); Maitreya Dutta, Hillsboro, OR (US); Robert Nemanich, Scottsdale, AZ (US); Franz Koeck, Tempe, AZ (US)

(73) Assignees: ARIZONA BOARD OF REGENTS ON BEHALF OF ARIZONA STATE UNIVERSITY, Scottsdale, AZ (US); THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 15/824,519

(22) Filed: Nov. 28, 2017

(65) Prior Publication Data
US 2018/0151715 A1 May 31, 2018

Related U.S. Application Data

(60) Provisional application No. 62/427,099, filed on Nov. 28, 2016.

(51) Int. Cl.
*H01L 29/778* (2006.01)
*H01L 29/66* (2006.01)
(Continued)

(52) U.S. Cl.
CPC .... *H01L 29/7787* (2013.01); *H01L 21/02115* (2013.01); *H01L 21/02236* (2013.01);
(Continued)

(58) Field of Classification Search
CPC .............. H01L 29/7725; H01L 29/7788; H01L 29/1037; H01L 29/6604; H01L 29/1602; H01L 29/66045; H01L 21/02115
See application file for complete search history.

(56) References Cited

U.S. PATENT DOCUMENTS 4,752,713 A    6/1988  Buxbaum
5,099,296 A *  3/1992  Mort ................... H01L 29/1602
                                              257/66
(Continued)

FOREIGN PATENT DOCUMENTS

EP      2884525 A1    6/2015
WO   2014105085 A1    7/2014

OTHER PUBLICATIONS

Kim, et al., "Analysis of delta-doped and uniformily doped AlGaAs/GaAs HEMT's by ensemble Monte Carlo simultion", IEEE trans. of elec. dev., vol. 38 No. 8, Aug. 1991,m pp. 1737-1742. (Year: 1991).*

(Continued)

*Primary Examiner* — Yu Chen
*Assistant Examiner* — Vincent Wall
(74) *Attorney, Agent, or Firm* — Withrow & Terranova, P.L.L.C.

(57) ABSTRACT

A semiconductor structure, device, or vertical field effect transistor is comprised of a drain, a drift layer disposed in a first direction relative to the drain and in electronic communication with the drain, a barrier layer disposed in the first direction relative to the drift layer and in electronic communication with the drain, the barrier layer comprising a current blocking layer and an aperture region, a two-dimen- (Continued)

sional hole gas-containing layer disposed in the first direction relative to the barrier layer, a gate electrode oriented to alter an energy level of the aperture region when a gate voltage is applied to the gate electrode, and a source in ohmic contact with the two-dimensional hole gas-containing layer. At least one of an additional layer, the drain, the drift region, the current blocking layer, the two-dimensional hole gas-containing layer, and the aperture region comprises diamond.

14 Claims, 17 Drawing Sheets

(51) Int. Cl.
| | |
|---|---|
| H01L 21/265 | (2006.01) |
| H01L 29/417 | (2006.01) |
| H01L 29/423 | (2006.01) |
| H01L 29/808 | (2006.01) |
| H01L 29/10 | (2006.01) |
| H01L 21/02 | (2006.01) |
| H01L 21/04 | (2006.01) |
| H01L 29/772 | (2006.01) |
| H01L 29/78 | (2006.01) |
| H01L 29/16 | (2006.01) |
| H01L 29/36 | (2006.01) |
| H01L 29/06 | (2006.01) |
| H01L 29/45 | (2006.01) |

(52) U.S. Cl.
CPC ........ *H01L 21/0415* (2013.01); *H01L 21/265* (2013.01); *H01L 29/0603* (2013.01); *H01L 29/1037* (2013.01); *H01L 29/1066* (2013.01); *H01L 29/1602* (2013.01); *H01L 29/365* (2013.01); *H01L 29/41741* (2013.01); *H01L 29/42356* (2013.01); *H01L 29/66045* (2013.01); *H01L 29/66462* (2013.01); *H01L 29/7725* (2013.01); *H01L 29/7781* (2013.01); *H01L 29/7788* (2013.01); *H01L 29/7827* (2013.01); *H01L 29/8083* (2013.01); *H01L 29/45* (2013.01)

(56) References Cited

U.S. PATENT DOCUMENTS

| | | | |
|---|---|---|---|
| 5,234,724 A | | 8/1993 | Schmidt |
| 5,298,766 A | * | 3/1994 | Kobashi ............... H01L 29/861 257/12 |
| 5,391,895 A | * | 2/1995 | Dreifus ............... H01L 29/0847 257/77 |
| 5,551,903 A | | 9/1996 | Kumar et al. |
| 5,578,886 A | | 11/1996 | Holmlid et al. |
| 5,631,196 A | | 5/1997 | Kane et al. |
| 5,635,258 A | | 6/1997 | Chen et al. |
| 5,944,573 A | | 8/1999 | Mearini et al. |
| 5,961,717 A | | 10/1999 | Kamo et al. |
| 6,489,704 B1 | | 12/2002 | Kucherov et al. |
| 6,563,256 B1 | | 5/2003 | Zavadil et al. |
| 6,582,513 B1 | | 6/2003 | Linares et al. |
| 7,662,441 B2 | | 2/2010 | Gicquel et al. |
| 8,075,359 B2 | | 12/2011 | Yamada et al. |
| 8,188,456 B2 | | 5/2012 | Nemanich et al. |
| 8,277,622 B2 | | 10/2012 | Scarsbrook |
| 8,617,651 B2 | | 12/2013 | Fox et al. |
| 8,876,973 B2 | | 11/2014 | Kato et al. |
| 8,878,190 B2 | | 11/2014 | Suzuki et al. |
| 2003/0001490 A1 | | 1/2003 | Yamamoto et al. |
| 2005/0110024 A1 | | 5/2005 | Swain et al. |
| 2007/0187718 A1 | * | 8/2007 | Suzuki .............. H01L 29/66462 257/194 |
| 2007/0284255 A1 | | 12/2007 | Gorokhovsky et al. |
| 2008/0042144 A1 | | 2/2008 | Tatsumi et al. |
| 2008/0246023 A1 | * | 10/2008 | Zeng ...................... B82Y 10/00 257/25 |
| 2009/0057684 A1 | * | 3/2009 | Otake .................. H01L 29/045 257/76 |
| 2009/0239078 A1 | | 9/2009 | Asmussen et al. |
| 2010/0327322 A1 | * | 12/2010 | Kub .................... H01L 29/0847 257/194 |
| 2012/0135575 A1 | | 5/2012 | Wong et al. |
| 2012/0248550 A1 | | 10/2012 | Huang et al. |
| 2012/0319127 A1 | * | 12/2012 | Chowdhury ...... H01L 29/66204 257/76 |
| 2014/0243937 A1 | * | 8/2014 | DiMauro ............. A61N 5/0601 607/92 |
| 2014/0264379 A1 | * | 9/2014 | Kub .................. H01L 29/41725 257/77 |
| 2015/0059974 A1 | | 3/2015 | Boyd, Jr. et al. |
| 2015/0104648 A1 | | 4/2015 | Wang |
| 2015/0137137 A1 | | 5/2015 | Chowdhury et al. |
| 2015/0228727 A1 | * | 8/2015 | Kato ..................... H01L 29/808 257/77 |
| 2015/0329989 A1 | | 11/2015 | Konovalov et al. |
| 2015/0349060 A1 | | 12/2015 | Suzuki et al. |
| 2016/0043260 A1 | | 2/2016 | Nemanich et al. |
| 2017/0330746 A1 | | 11/2017 | Koeck et al. |

OTHER PUBLICATIONS

Semiconductors today: compounds & Advanced Silicon, "Vertical gallium nitride transistors with buried p-type current blocking", May 21, 2015, http://www.semiconductor-today.com/news_items/2015/may/ucsb_210515.shtml (Year: 2015).*

S. Chowdhury, "Future Power Electronics with GaN and Diamond", 228th ECS meeting, Phoenix AZ, Oct. 11-15, 2015 (abstract), pp. 1-2 (Year: 2015).*

Notice of Allowance for U.S. Appl. No. 15/151,295, dated Jun. 29, 2018, 13 pages.

Koeck, F. A. M., et al., "Diamond High Temperature Electronics: Growth and Process Related Defects and their Impact," PowerPoint Presentation, Presented at the 4th French-Japanese Workshop on Diamond Power Devices, Oct. 29-Nov. 1, 2017, Okinawa, Japan, 35 pages.

Aleksov, A., et al., "Diamond junction FETs based on δ-doped channels," Diamond & Related Materials, vol. 8, Nos. 2-5, Mar. 1999, pp. 941-945.

Baumann, P. K., "Surface cleaning, electronic states and electron affinity of diamond (100), (111) and (110) surfaces," Surface Science, vol. 409, Issue 2, Jul. 1, 1998, pp. 320-355.

Ben-Yaacov, I., "AlGaN/GaN Current Aperture Vertical Electron Transistor," PhD Dissertation, University of California, Santa Barbara, Mar. 2004, 152 pages.

Corbella, C., et al., "Low friction and protective diamond-like carbon coatings deposited by asymmetric bipolar pulsed plasma," Diamond and Related Materials, vol. 18, Issues 5-8, May-Aug. 2009, pp. 1035-1038.

Dutta, M., et al., "High Voltage Diodes in Diamond Using (100)- and (111)- Substrates," IEEE Electron Device Letters, vol. 38, No. 5, May 1, 2017, pp. 600-603.

Dutta, M., et al., "P-i-n diodes enabled by homoepitaxially grown phosphorus doped diamond with breakdown electric field >1.25 MV/cm," 2015 73rd Annual Device Research Conference (DRC), Columbus, Ohio, USA, Jun. 21-24, 2015, 2 pages\.

Element Six, "The Element Six CVD Diamond Handbook," Available online at: <<https://e6cvd.com/media/wysiwyg/pdf/E6_CVD_Diamond_Handbook_A5_v10X.pdf>>, Access Aug. 23, 2018, 28 pages.

Imura, M. et al. "Demonstration of diamond field effect transistors by AlN/diamond heterostructure," Physica Status Solidi RRL, vol. 5, No. 3, Mar. 2011, pp. 125-127.

Janssen, W., et al., "Substitutional phosphorus incorporation in nanocrystalline CVD diamond thin film," Physica Status Solidi RRL, vol. 8, No. 8, 2014, pp. 705-709.

(56) References Cited

OTHER PUBLICATIONS

Kasu, M., et al., "2 W/mm output power density at 1 GHz for diamond FETs," IEEE Electron Device Letters, vol. 41, No. 22, Oct. 27, 2005, pp. 1249-1250.

Kato, H. et al., "Characterization of specific contact resistance on heavily phosphorus-doped diamond films," Diamond & Related Materials, vol. 18, Issues 5-8, May-Aug. 2009, pp. 782-785.

Kato, H., et al., "Heavily phosphorus-doped nano-crystalline diamond electrode for thermionic emission application," Diamond & Related Materials, vol. 63, Mar. 2016, pp. 165-168.

Kato, H., et al., "n-type diamond growth by phosphorus doping (0 0 1)-oriented surface," Journal of Physics D: Applied Physics, vol. 40, Oct. 5, 2007, pp. 6189-6200.

Kawarada, H., "High-Current Metal Oxide Semiconductor Field-Effect Transistors on H-Terminated Diamond Surfaces and Their High-Frequency Operation," Japanese Journal of Applied Physics, vol. 51, Article No. 090111, Sep. 4, 2012, 6 pages.

Koeck, F. A. M., et al., "Low temperature onset for thermionic emitters based on nitrogen incorporated UNCD films," Diamond & Related Materials, vol. 18, Dec. 2008, pp. 232-234.

Koeck, F. A. M., et al., "Thermionic electron emission from low work-function phosphorus doped diamond films," Diamond & Related Materials, vol. 18, Jan. 21, 2009, pp. 789-791.

Koeck, F. A. M., et al., "Enhanced thermionic energy conversion and thermionic emission from doped diamond films through methane exposure," Diamond & Related Materials, vol. 20, Issue 8, Aug. 2011, pp. 1229-1233.

Koeck, F. A. M., et al., "Substrate-diamond interface considerations for enhanced thermionic electron emission from nitrogen doped diamond films," Journal of Applied Physics, vol. 112, Article No. 113707, Dec. 6, 2012.

Koeck, F. A. M., et al., "Doped diamond thin film electron sources for thermionic energy conversion," 2013 26th International Vacuum Nanoelectronics Conference, Roanoke, Virginia, USA, pp. 1-3.

Koizumi, S., et al., "Phosphorus-doped chemical vapor deposition of diamond," Diamond & Related Materials, vol. 9, Issues 3-6, Apr.-May 2000, pp. 935-940.

Luong, J. H. T., et al., "Boron-doped diamond electrode: synthesis, characterization, functionalization and analytical applications," Analyst, vol. 134, 2009, pp. 1965-1979.

Maida, O., et al., "Substrate temperature optimization for heavily-phosphorus-doped diamond films grown on vicinal (001) surfaces using high-power-density microwave-plasma chemical-vapor-deposition," Journal of Crystal Growth, vol. 424, May 5, 2015, pp. 33-37.

Nakazawa, H., et al., "Influence of duty ratio of pulsed bias on structure and properties of silicon-doped diamond-like carbon films by plasma deposition," Thin Solid Films, vol. 539, May 24, 2013, pp. 134-138.

Nemanich, R. J., et al., "CVD Diamond—Research, applications and challenges," MRS Bulletin, vol. 39, Jun. 2014, pp. 490-494.

Ohtani, R., et al., "Large improvement of phosphorus incorporation efficiency in n-type chemical vapor deposition of diamond," Applied Physics Letters, vol. 105, Article No. 232106, Dec. 9, 2014.

Pinault-Thaury, M.-A., et al., "n-Type CVD diamond: Epitaxy and doping," Materials Science and Engineering: B, vol. 176, Issue 11, Oct. 25, 2011, pp. 1401-1408.

Pinault-Thaury, M.-A., et al., "Phosphorus donor incorporation in (1 0 0) homoepitaxial diamond: Role of the lateral growth," Journal of Crystal Growth, vol. 335, 2011, pp. 31-36.

Russell, S. A. O., et al., "Hydrogen-Terminated Diamond Field-Effect Transistors With Cutoff Frequency of 53 GHz," IEEE Electron Device Letters, vol. 33, No. 10, Oct. 2012, pp. 1471-1473.

Schauer, S. N., et al., "Phosphorus incorporation in plasma deposited diamond films," Applied Physics Letters, vol. 64, Issue 9, Feb. 28, 1994, pp. 1094-1096.

Schwede, J. W., et al., "Photon-enhanced thermionic emission for solar concentrator systems," Nature Materials, vol. 9, Aug. 1, 2010, pp. 762-767.

Schwede, J. W., et al., "Photon-enhanced thermionic emission from heterostructures with low interface recombination," Nature Communications, vol. 4, Article No. 1576, Mar. 12, 2013, 6 pages.

Segev, G., et al., "High performance isothermal photo-thermionic solar converters," Solar Energy Materials & Solar Cells, vol. 113, Jun. 2013, pp. 114-123.

Shikata, S., "Single crystal diamond wafers for high power electronics," Diamond & Related Materials, vol. 65, Mar. 18, 2016, pp. 168-175.

Smith, J. R., "Thermionic Energy Conversion and Particle Detection Using Diamond and Diamond-Like Carbon Surfaces," PhD Thesis, North Carolina State University, Raleigh, North Carolina, USA, 2007.

Stenger, I., et al., "Impurity-to-band activation energy in phosphorus doped diamond," Journal of Applied Physics, vol. 114, Article No. 073711, Aug. 21, 2013.

Sun, T., "Combined Photo- and Thermionic Electron Emission from Low Work Function Diamond Films," PhD Thesis, Arizona State University, Tempe, Arizona, USA, Dec. 2013.

Sun, T., et al., "Combined visible light photo-emission and low temperature thermionic emission from nitrogen doped diamond films," Applied Physics Letters, vol. 99, Article No. 202101, 2011.

Sun, T., et al., "Thermally enhanced photoinduced electron emission from nitrogen-doped diamond films on silicon substrates," Physical Review B, vol. 90, Article No. 121302(R), Sep. 15, 2014.

Sun, T., et al., "Thermionic and photon-enhanced emission from CVD diamond and new approaches for energy conversion," PowerPoint Presentation Presented at the International Workshop on Photon-Enhanced Thermionic Emission, Tel Aviv, Israel, 2014.

Ueda, K., et al., "Diamond FET Using High-Quality Polycrystalline Diamond with fT of 45 GHz and fmax of 120 GHz," IEEE Electron Device Letters, vol. 27, No. 7, Jul. 2006, pp. 570-572.

Wort, C. J. H., et al., "Diamond as an electronic material," Materials Today, vol. 11, Nos. 1-2, Jan.-Feb. 2008, pp. 22-28.

Yamasaki, S., et al., "Doping and interface of homoepitaxial diamond for electronic applications," MRS Bulletin, vol. 39, No. 6, Jun. 2014, pp. 499-503.

Non-Final Office Action for U.S. Appl. No. 15/151,295, dated Jul. 22, 2016, 25 pages.

Final Office Action for U.S. Appl. No. 15/151,295, dated Nov. 14, 2016, 30 pages.

Advisory Action for U.S. Appl. No. 15/151,295, dated Jan. 23, 2017, 3 pages.

Non-Final Office Action for U.S. Appl. No. 15/151,295, dated Mar. 29, 2017, 25 pages.

Final Office Action for U.S. Appl. No. 15/151,295, dated Aug. 10, 2017, 27 pages.

Advisory Action for U.S. Appl. No. 15/151,295, dated Nov. 30, 2017, 3 pages.

Non-Final Office Action for U.S. Appl. No. 15/151,295, dated Dec. 18, 2017, 27 pages.

Applicant-Initiated Interview Summary for U.S. Appl. No. 15/151,295, dated Feb. 9, 2018, 4 pages.

* cited by examiner

DIAMOND BASED CURRENT APERTURE VERTICAL TRANSISTOR AND METHODS OF MAKING AND USING THE SAME

CROSS-REFERENCE TO RELATED APPLICATIONS

This application is based on, claims the benefit of, and claims priority to U.S. Provisional Application No. 62/427,099, filed Nov. 28, 2016, which is hereby incorporated herein by reference in its entirety for all purposes.

STATEMENT REGARDING FEDERALLY SPONSORED RESEARCH

This invention was made with government support under DE-AR0000453 awarded by the Department of Energy. The government has certain rights in the invention.

BACKGROUND

Power semiconductor transistors, such as power metal-oxide-semiconductor field-effect transistors (MOSFETs) and insulated gate bipolar transistors (IGBTs), are typically fabricated with silicon (Si) semiconductor material. Recently, silicon carbide (SiC) power devices have been considered due to superior properties. Gallium nitride (GaN) devices have also emerged as attractive candidates to carry large currents, support high voltages, and provide very low on-resistance and fast switching times.

An ideal power switch has zero conduction and switching loss. Conduction loss limits the maximum operating voltages of current unipolar devices to around 600 V, which otherwise have very low switching loss due to the absence of stored charge. Bipolar devices such as IGBTs can overcome this problem, but generally suffer from high switching loss.

Typical power semiconductor transistors can have both lateral and vertical topologies. A vertical structure for a power device is often better suited for handling relatively high power (e.g., on the order of several kWs). The breakdown voltage of such devices is not limited by edge effects, but rather by material properties because the electric field is buried in the bulk of the material. GaN devices use a modified version of a double-defused metal-oxide-semiconductor field-effect transistor (MOSFET) (sometimes referred to as a DMOS) structure used in Si, that is sometimes referred to as a current aperture vertical electron transistor (CAVET). A CAVET generally has a source formed by a two-dimensional electron gas in the GaN at the AlGaN/GaN interface. A drain includes a drift layer of lightly doped n-type GaN with a heavily doped n-layer to form an ohmic contact for the drain. A current blocking layer (CBL) which either provides a potential barrier, or is insulating, separates the source from the drain. Thus the CBL can either be formed by p-type GaN (grown or implanted), by using an insulating layer, or a higher bandgap material like AlN. An aperture in the current blocking layer which is formed using conductive material can insure that the current flow from the source to drain is vertical.

Power electronic switches fabricated using GaN are generally limited by the material properties such as, for example, a bandgap of 3.2 eV at 300 degrees Kelvin (K) which corresponds to a breakdown field of ~5 megavolts per centimeter (MV/cm). The thermal properties of GaN can limit the operational ability of these devices, which is sometimes addressed in high electron mobility transistors (HEMTs) by using diamond as a heat sink.

Considering such limitations of approaches using GaN and similar semiconductor materials, new systems and methods for a vertical transistor that has a larger bandgap and improved thermal properties would be desirable.

SUMMARY OF THE INVENTION

The subject matter disclosed herein overcomes the aforementioned drawbacks of material properties by presenting semiconductor structures, devices, and methods of making and using diamond current aperture vertical transistors.

In one aspect, the present disclosure provides a semiconductor structure, device, or vertical field effect transistor. The semiconductor structure, device, or vertical field effect transistor is comprised of a drain, a drift layer disposed in a first direction relative to the drain and in electronic communication with the drain, a barrier layer disposed in the first direction relative to the drift layer and in electronic communication with the drain, the barrier layer comprising a current blocking layer and an aperture region, a two-dimensional hole gas-containing layer disposed in the first direction relative to the barrier layer, a gate electrode oriented to alter an energy level of the aperture region when a gate voltage is applied to the gate electrode, and a source in ohmic contact with the two-dimensional hole gas-containing layer. At least one of an additional layer, the drain, the drift layer, the current blocking layer, the two-dimensional hole gas-containing layer, or the aperture region comprises diamond.

In another aspect, the present disclosure provides a method of making a semiconductor structure, device, or current aperture vertical transistor. The method comprises: obtaining, growing, or forming a substrate comprising a functional bilayer comprising a barrier layer and a two-dimensional hole gas-containing layer disposed in a first direction relative to the barrier layer, the barrier layer comprising a current blocking layer and an aperture region. The method further comprises forming a drift layer disposed in a second direction opposite the first direction relative to the functional bilayer and in electronic communication with the current blocking layer. The method additionally comprises forming a drain disposed in the second direction opposite the first direction relative to the functional bilayer. The method further comprises forming a gate electrode oriented to provide an energy level of the barrier layer to form the aperture region when a gate voltage is applied exceeding a threshold voltage, wherein at least one of an additional layer, the two-dimensional hole gas-containing layer, the current blocking layer, the aperture region, the drift region, and the drain comprises diamond.

In another aspect, the present disclosure provides a method of making a semiconductor device. The method comprises: obtaining, growing, or forming a diamond substrate comprising a functional bilayer comprising a barrier layer and a two-dimensional electron gas-containing layer disposed in a first direction relative to the barrier layer, the barrier layer formed without a regrowth step. The method further comprises removing a portion of the functional bilayer to form a gate region, and depositing a dielectric material in the gate region atop the two-dimensional hole gas-containing layer in the first direction relative to the two-dimensional hole gas-containing layer. The method additionally comprises removing two portions of the dielectric material atop the two-dimensional electron gas-containing layer to form source regions. Further, the method comprises forming source electrodes in ohmic contact with the two-dimensional hole gas-containing layer in the source regions and forming a gate electrode atop the dielectric material in the gate region. The method additionally comprises forming a drain disposed in a second direction opposite the first direction relative to the functional bilayer.

The foregoing and other advantages of the disclosure will appear from the following description. In the description, reference is made to the accompanying drawings which form a part hereof, and in which there is shown by way of illustration certain aspects of the disclosure. These aspects do not necessarily represent the full scope of the disclosure, however, and reference is made therefore to the claims and herein for interpreting the scope of the disclosure.

DETAILED DESCRIPTION OF THE INVENTION

Figure 1:
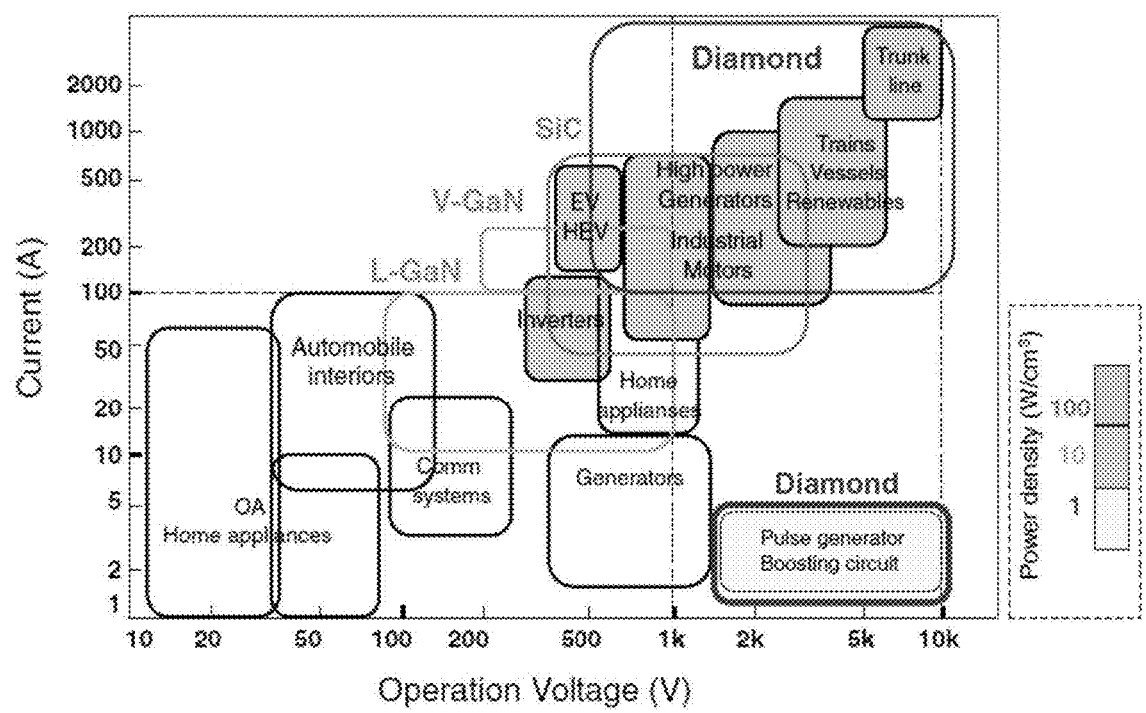
FIG. 1 is a graph showing areas of power electronics in which diamond can be used.

Various aspects of the subject technology are now described with reference to the annexed drawings, wherein like reference numerals correspond to similar elements throughout the several views. It should be understood, however, that the drawings and detailed description hereafter relating thereto are not intended to limit the claimed subject matter to the particular form disclosed. Rather, the intention is to cover all modifications, equivalents, and alternatives falling within the spirit and scope of the claimed subject matter.

As used herein, the singular forms "a", "an", and "the" include plural aspects unless the context clearly dictates otherwise.

This disclosure provides semiconductor structures, devices, diamond current aperture vertical transistors, and methods of making and using the same.

Specific structures, devices, transistors, and methods relating to diamond current aperture vertical transistors have been disclosed. It should be apparent to those skilled in the art that many additional modifications beside those already described are possible without departing from the inventive concepts. In interpreting this disclosure, all terms should be interpreted in the broadest possible manner consistent with the context. Variations of the term "comprising" should be interpreted as referring to elements, components, or steps in a non-exclusive manner, so the referenced elements, components, or steps can be combined with other elements, components, or steps that are not expressly referenced. Embodiments referenced as "comprising" certain elements are also contemplated as "consisting essentially of" and "consisting of" those elements.

The exceptional electronic, thermal, and mechanical properties of diamond make diamond an ideal candidate for applications in high power devices which can operate in extreme environments of temperature and radiation. The high carrier mobility of diamond (>1800 centimeters squared per volt-second ($cm^2$/V-s) for holes and >2100 $cm^2$/V-s) can enable realization of devices with large output current and low ON-Resistance ($R_{on}$). The wide bandgap of diamond can facilitate realization of devices with breakdown fields in the range of 20 MV/cm which can bring a drastic reduction in form factor. Electronic devices made using diamond can have large thermal conductivity (e.g., 22-25 W/cm·K) and can have a low coefficient of thermal expansion (0.45 parts per million (ppm)/K at 200 K to 5.87 ppm/K at 1600 K) which can enable operation at very high temperatures and can also improve the overall system efficiency due to the absence of an external cooling system.

The high bandgap of diamond can facilitate fabrication of switches which can offer voltage control in the 10 kilovolt (kV) range which is currently not achievable using other materials. FIG. 1 is a chart from S. Shikata, "Single crystal diamond wafers for high power electronics", Diamond Relat. Mater., vol. 65, pp. 168-175, May 2016, which is hereby incorporated by reference herein in its entirety, showing examples of the projected range and areas of application of diamond power devices. For example, diamond can also offer a cheaper, more robust and smaller alternative to vacuum tubes. As another example, the exceptional properties of diamond can allow it to compete with SiC and GaN for microwave applications up to 100 GHz. As yet another example, diamond devices can be ideal for traction control where a high starting torque at low initial speed is needed.

Fabricating devices using diamond can result in a reduction in form factor that can facilitate miniaturization of the size of electronic control nodes. Such nodes are an integral part of electric power systems, and can be especially important as technology moves towards renewable forms of energy where small interconnected nodes with variable capability can be used to form the generation, distribution and control network.

Diamond devices can have both lateral and vertical topologies. When exposed to hydrogen plasma diamond can form a hydrogen(H)-terminated layer on the surface. This diamond surface can be lightly p-type or even undoped. The H-terminated diamond, when exposed to air and/or on adsorption of certain gas species (e.g., $NO_2$, Ozone ($O_3$), NO, $SO_2$, and others), can form a two-dimensional hole gas. In a lateral configuration which utilizes this two-dimensional hole gas, a dielectric layer (typically $Al_2O_3$, $HfO_2$, $MoO_2$, $LaAlO_3$, or the like, or a combination of these) is deposited above the channel with the source and drain on the same plane; whereas the gate sits on top of the channel acting as the control electrode modulating the charge flow through the channel. In an alternate lateral configuration, diamond devices can also be fabricated using a Junction Field Effect Transistor (JFET) configuration. A lightly p-type channel is sandwiched between $n^+$ layer on which the gate is fabricated. The source and drain ohmic contacts can then form using heavily doped $p^+$ contacts below them. An n-type channel configuration can also be realized by appropriately reversing the polarities.

In certain aspects an ohmic contact might be deposited on the source and drain contact and the gate can be formed by a schottky contact to modulate the charge flow.

In certain aspects of the lateral configuration a heterojunction between diamond and a higher bandgap material (like AlN, or BN) can be used where holes accumulate in the diamond close to the interface to form the channel.

In certain aspects the FETs can be fabricated using a delta doped channel formed by a thin heavily boron doped p-type channel around the order of 1 nm and a doping concentration >1E20/cm³. To remove any parasitic leakage paths one or more compensation techniques can be used, such as by using an n-type dopant like Phosphorus, Nitrogen, Arsenic, Sulfur, or the like.

The high frequency response of a field effect transistor can be determined by a FET's saturation velocity. Diamond with an optical phonon energy as high as 160 milli-electron volts meV can have one of the highest saturation velocities: in the range of about $0.85-1.2 \times 10^7$ cm/s for holes and about $1.5-2.7 \times 10^7$ cm/s for electrons. The advantage of diamond lies in the fact that these velocities can be reached at relatively low magnitudes of electric field in the range of 10 kV/cm.

Figure 2:
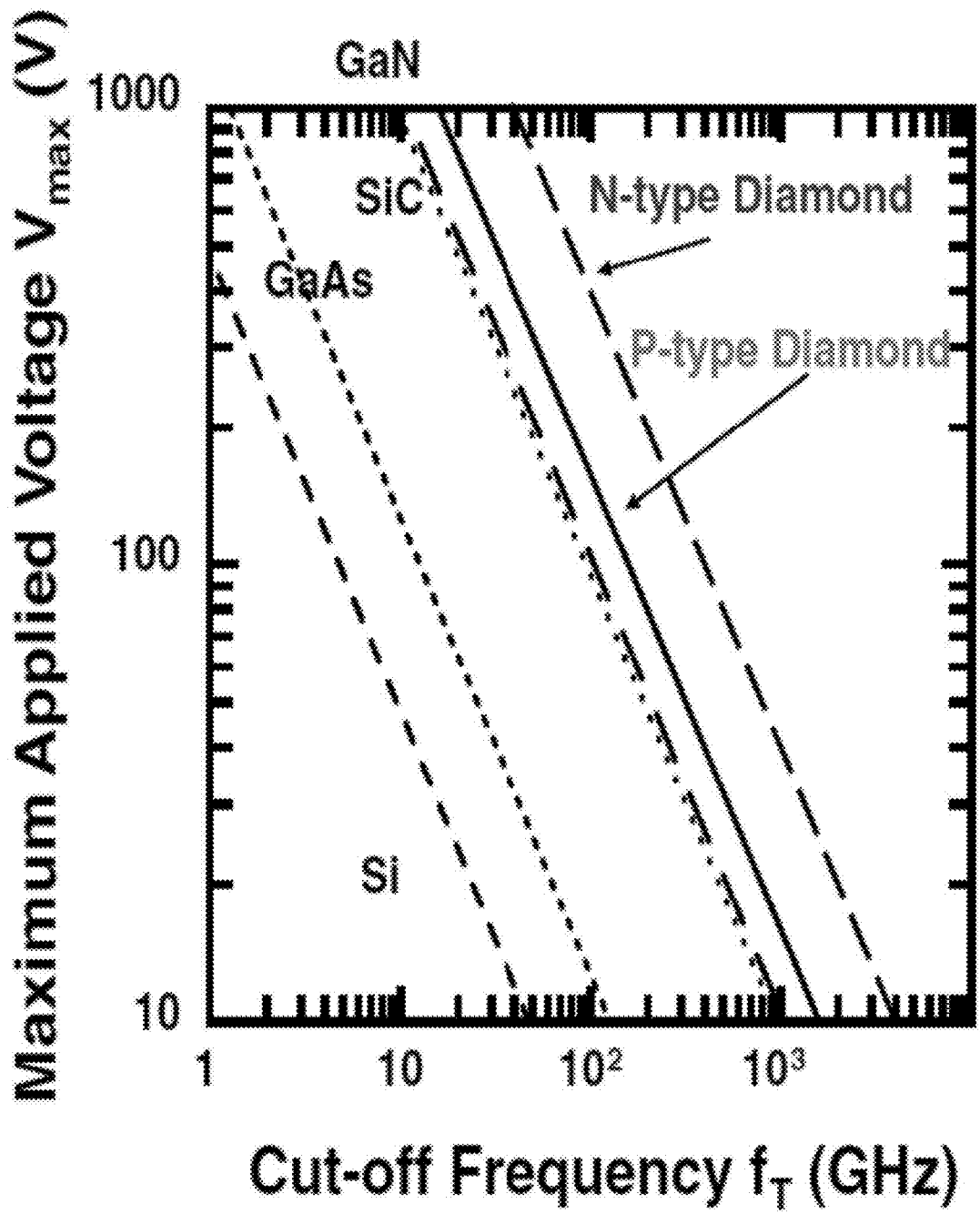
FIG. 2 is a graph comparing diamond to other commonly used wide bandgap semiconductors.

In some cases, the product of the cutoff-frequency ($f_T$) and the maximum operating voltage ($V_{max}$) can be used to compare different field effect transistors. FIG. 2 shows a graph of $f_T$ versus $V_{max}$ for diamond and other semiconductors from H. Kawarada, "High-Current Metal Oxide Semiconductor Field-Effect Transistors on H-Terminated Diamond Surfaces and Their High-Frequency Operation", Jpn. J. Appl. Phys., vol. 51, pp. 090111-1-090111-6, Sep. 2012, which is hereby incorporated by reference herein in its entirety. As shown in FIG. 2, diamond surface channel FETs are predicted to have a relatively high maximum applied voltage ($V_{max}$) for a given $f_T$. Additionally, diamond surface channel FETs have demonstrated relatively high values for $f_T$, $f_{max}$, and output power at 1 GHz. For example, certain diamond surface channel FETs have been demonstrated to have an $f_T$ of ~53 GHz, an $f_{max}$ ~120 GHz and an output power of 2.1 milliwatts per millimeter (mW/mm) at 1 GHz (see, e.g., S. A. O. Russell et al., "Hydrogen-Terminated Diamond Field-Effect Transistors With Cutoff Frequency of 53 GHz," IEEE Electron Device Lett., vol. 33, no. 10, pp. 1471-1473, Oct. 2012; K. Ueda et al., "Diamond FET Using High-Quality Polycrystalline Diamond with fT of 45 GHz and $f_{max}$ of 120 GHz," IEEE Electron Device. Lett., vol. 27, no. 7, pp. 570-572, Jul. 2006; and M. Kasu et al., "2 W/mm output power density at 1 GHz for diamond FETs", IEEE Electron Lett., vol. 41, no. 22, pp. 1249-1250, Oct. 2005; each of the preceding references is incorporated by reference herein in its entirety).

Figure 3A:
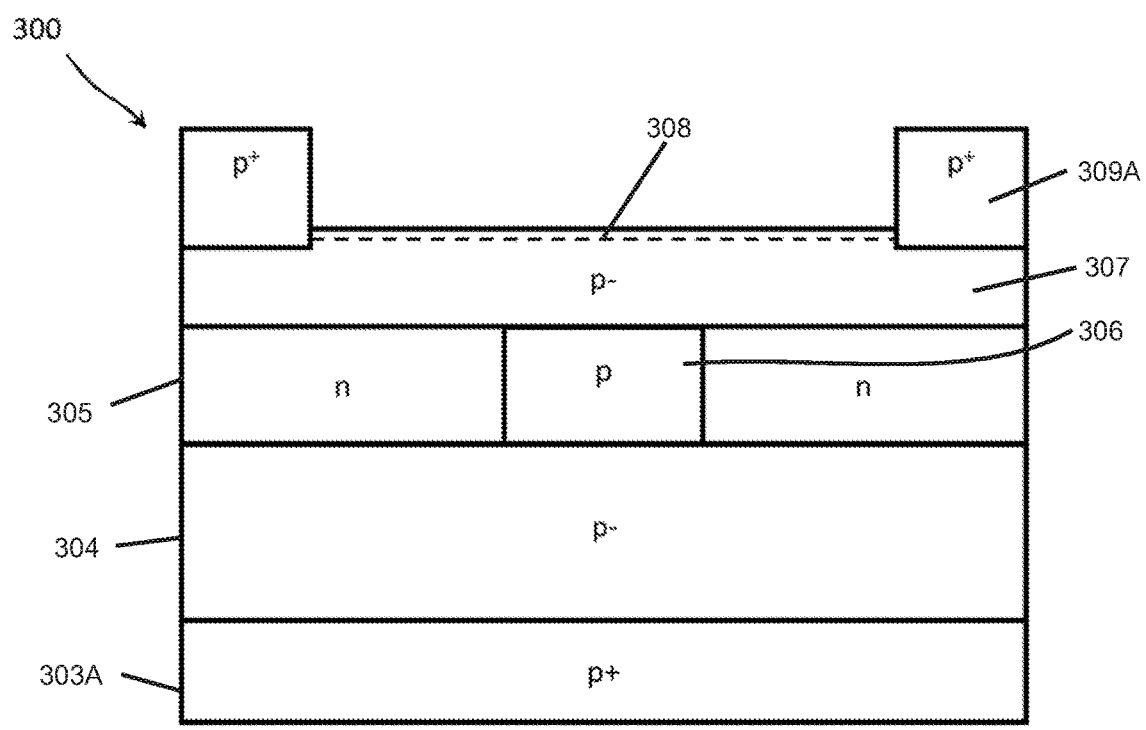
FIG. 3A is a non-limiting aspect of a semiconductor structure for a diamond based current aperture vertical transistor.
Figure 3B:
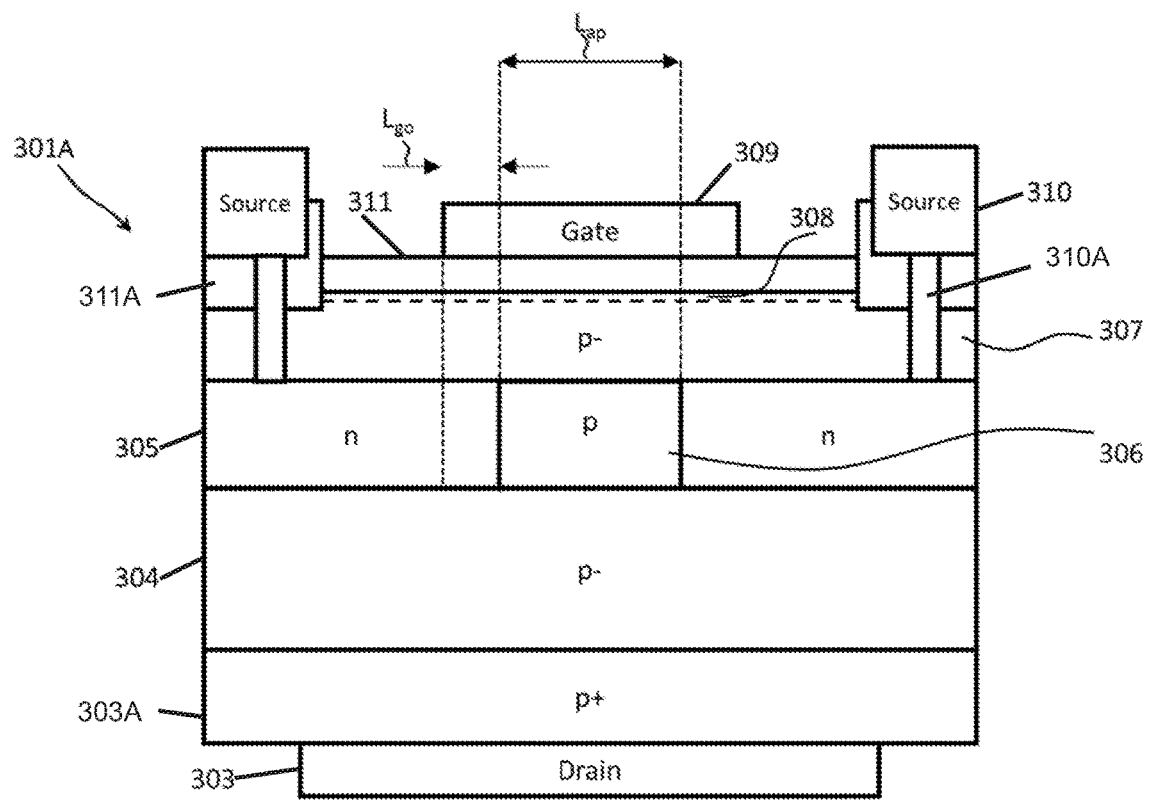
FIG. 3B is a non-limiting aspect of a device structure for a diamond based current aperture vertical transistor without a separate substrate.
Figure 3C:
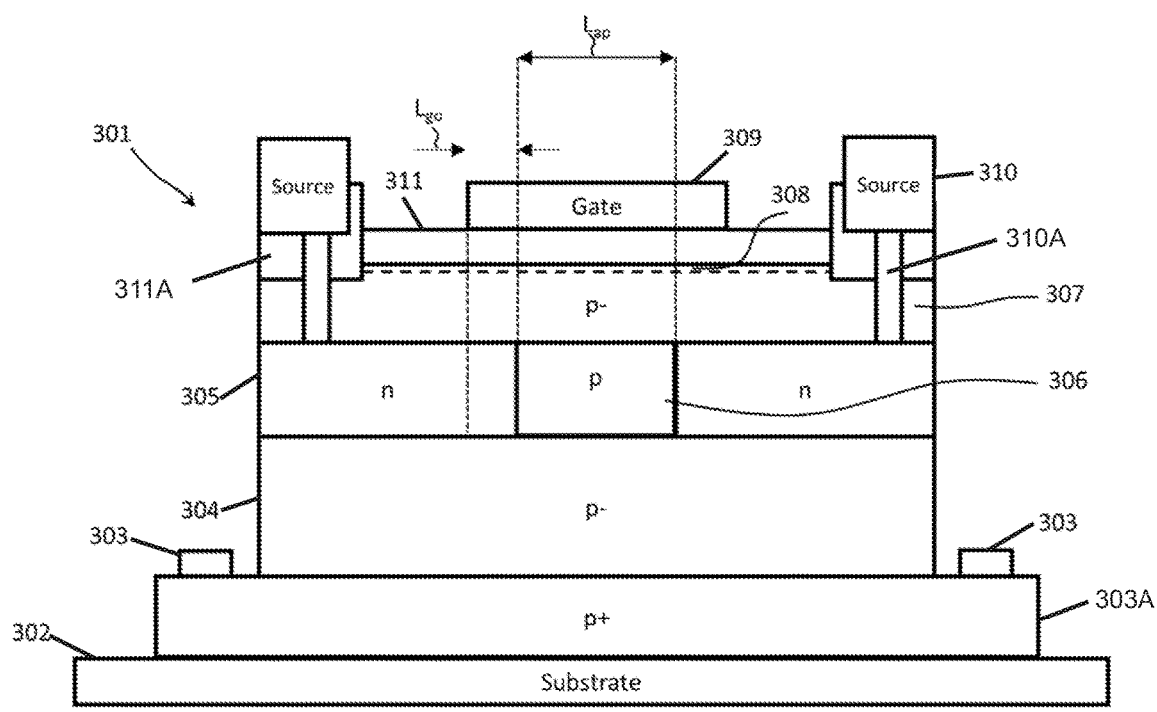
FIG. 3C is a non-limiting aspect of a device structure for a current aperture vertical transistor with a substrate material with layers for a diamond current.

Referring to FIGS. 3A-3C, in certain aspects, a semiconductor structure 300, a device 301A, or a diamond current aperture vertical transistor 301 of the present disclosure can comprise one or more of the following: a substrate 302, a drain 303, a current spreading layer 303A, a drift layer 304, a current blocking layer (CBL) 305, an aperture region 306, a p– diamond layer 307, a two dimensional hole gas (2DHG) layer 308, a gate 309, a source 310, vias 310A, an insulating layer 311A, and a dielectric layer 311.

The drain 303 can serve as the base of the semiconductor structure 300, device 301A, or diamond current aperture vertical transistor 301 of the present invention. The drain 303 is the target for the flow of holes through the device 301A or diamond vertical transistor 301. The drain 303 can comprise a drain material. In certain aspects, any material that functions suitably as a drain and allows growth of a layer coupled to and disposed adjacent to the drain 303 in the vertical direction can be used with the present invention.

In certain aspects, the drain 303 can have a thickness ranging from about 1 nm to about 2.0 mm. In aspects in which the drain 303 is very thin, the semiconductor structure 300 can be bonded to a carrier wafer.

The substrate 302 can be coupled to the drain 303 and disposed adjacent to the drain 303 in the vertical direction. Alternatively, the drain 303 can be coupled to the substrate 302 and disposed adjacent to the substrate 302 in the vertical direction. In certain aspects, a single material can serve as both the drain 303 and the substrate 302.

The substrate 302 can comprise a substrate material. Examples of suitable substrate materials include, but are not limited to, type I and type II single crystal diamond, and cubic boron nitride (c-BN).

In certain non-limiting aspects, the substrate 302 can have a thickness ranging from about 1 nm to about 2.0 mm. Alternatively, the substrate 302 can have a thickness within a different range. A thin substrate 302 can be bonded to a carrier substrate for ease of making and using the same.

A current spreading layer 303A can be coupled to the drain 303 or the substrate 302 and disposed adjacent to the respective drain 303 or substrate 302 in the vertical direction.

The current spreading layer 303A can comprise a current spreading material. Examples of suitable current spreading material include, but are not limited to, p+/n+ diamond, and p– and n– type diamond.

In certain aspects, the current spreading layer 303A can have a thickness ranging from about 1 nm to about 2 mm. Alternatively, the current spreading layer 303A can have a thickness within a different range.

The current spreading material can comprise a current spreading dopant. In certain aspects, the current spreading dopant can comprise boron, sodium, lithium, hydrogen, phosphorus, nitrogen, arsenic, sulfur, and the like. In certain aspects, the current spreading material can comprise current spreading dopant in an amount ranging from about $1\times10^{17}$ cm$^{-3}$ to about $5\times10^{21}$ cm$^{-3}$. Alternatively, the current spreading material can comprise spreading dopant in an amount within a different range. In certain aspects, the current spreading material can have a carrier mobility ranging from about 5 cm$^2$/V·s to about 1100 cm$^2$/V·s. Alternatively, the current spreading material can have a carrier mobility within a different range.

The drift layer 304 can be coupled to the drain 303, the substrate 302, or the current spreading layer 303A, and disposed adjacent to the respective drain 303, substrate 302, or current spreading layer 303A in the vertical direction.

The drift layer 304 can comprise a drift region material. Examples of suitable drift region materials include, but are not limited to, p– diamond, n– diamond, and intrinsic diamond.

In certain aspects, the drift layer 304 can have a thickness of at least about 500 nm. Alternatively, the drift layer 304 can have any other thickness.

The drift region material can comprise a drift region dopant. In certain aspects, the drift region dopant can comprise boron, sodium, lithium, hydrogen, phosphorus, nitrogen, arsenic, sulfur, and the like. In certain aspects, the drift region material can comprise drift region dopant in an amount ranging from about $1\times10^{13}$ cm$^{-3}$ to about $5\times10^{17}$ cm$^{-3}$. Alternatively, the drift region material can comprise drift region dopant in an amount within a different range. In certain aspects, the drift region material can have a carrier mobility ranging from about 50 cm$^2$/V·s to >2000 cm$^2$/V·s. Alternatively, the drift region material can have a carrier mobility within a different range.

The CBL 305 can comprise a barrier material. The character of the barrier material can be impacted by the character of the materials immediately adjacent to the barrier material, in particular, the 2DHG-containing material. In other words, the barrier material can exhibit current blocking properties under some conditions and can lack current blocking properties under other conditions. In preferred aspects, the barrier material can be lattice matched so that an epitaxial high quality material on which the channel forms can be grown. The quality of the barrier material can have a significant effect on the mobility and charge concentration in the channel. Examples of suitable barrier layer materials include, but are not limited to, p- or n-type diamond, oxygen-terminated diamond, insulating diamond, intrinsic diamond, c-BN, and AlN.

In certain aspects, the CBL 305 and the aperture region 306 can be comprised of the same material. In certain aspects, the CBL 305 and the aperture region 306 can be formed by doping or implantation. In preferred aspects, the CBL 305 and the aperture region 306 may not be formed by a regrowth process.

Figure 4:
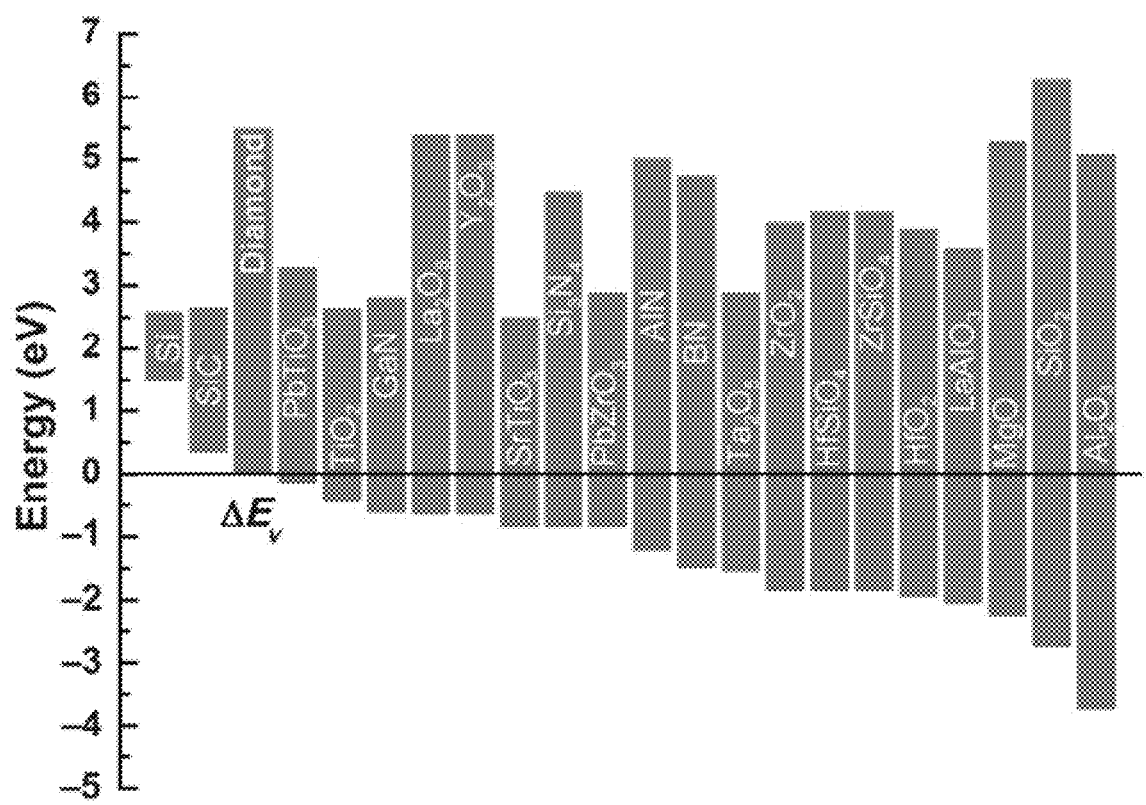
FIG. 4 depicts the energy band offset of different semiconductor materials with respect to diamond.

In certain aspects, the CBL 305 is grown as an epitaxial layer on top of the drift layer 304 and offers a barrier to the flow of carriers. A phosphorus doped n-type layer can offer a barrier to the flow of holes and likewise p-type to the flow of electrons. The aperture region 306 can be etched and regrown in this aspect, which can involve lateral epitaxial overgrowth. In certain aspects, the CBL 305 can be formed by ion-implantation, such that post-implantation the CBL 305 region of the structure is rendered insulating. In certain aspects, the CBL 305 can be formed by rendering a diamond film insulating using an ultraviolet-ozone (UV-ozone) process (e.g., in which molecules of oxygen are broken down and synthesized into ozone molecules, and the ozone molecules are decomposed to generate activated oxygen), or through exposure to oxygen plasma (O-plasma), which can render it insulating. In certain aspects, a conductive layer can be grown and part of it compensated using ion-implantation. The compensated region forms the CBL 305 and the un-compensated doped region forms the aperture region 306. In certain aspects, the CBL 305 can be formed by compensation using ion-implantation followed by suitable doping which offers a barrier to the flow of carriers in the device structure. In certain aspects, a material which can have a suitable band-offset with diamond can be used as a barrier material. Such a material can be, but is not limited to, c-BN which is: lattice matched to diamond; can have a larger bandgap than 6.4 eV; and can have a valence band offset as shown in FIG. 4. The CBL 305 can be grown by selective area regrowth by etching away the appropriate regions of the layer forming the aperture region 306. In preferred aspects, the CBL 305 can be formed by selective area regrowth after the appropriate region of the layer forming the aperture is etched away.

In certain aspects, the aperture region 306 can be formed using selective area regrowth, implantation, compensation, and/or techniques similar to the growth of the CBL 305 region as described above. In certain aspects, utilizing the selective area regrowth approach, the vertical growth rate may be greater than the lateral growth rate, and in this case there may be formation of overgrowth structures at the interface of the CBL 305 and the aperture region 306, which may result in early breakdown due to the peak of the electric field being at these sharp edges. A diamond polish step following regrowth can render the surface smooth for regrowth of the 2DHG containing layer.

In certain aspects, the CBL 305 and the aperture region 306 can be formed by a two-step implantation of intrinsic diamond where the other layer is masked appropriately using photoresist, metal, hard mask, or the like, resulting in a self-aligned structure.

In certain aspects, the 2DHG layer 308 can comprise a 2DHG. The 2DHG can have an electron density ranging from about $1\times10^{11}$ cm$^{-2}$ to about $1\times10^{14}$ cm$^{-2}$. Alternatively, the 2DHG can have an electron density within a different range. The 2DHG can have a hole mobility ranging from about 10 cm$^2$/V·s to about 300 cm$^2$/V·s. Alternatively, the 2DHG can have a hole mobility within a different range.

The 2DHG layer 308 can be formed by H-terminating the diamond surface which may or may not be doped. Note that H-termination of the diamond surface alone may not be sufficient to cause formation of the 2DHG. For example, H-termination in combination with exposure to atmospheric air can, in certain aspects, cause the initial formation of the 2DHG. In certain aspects, the charge density can be increased to about $5\times10^{13}$/cm$^2$ to about $1\times10^{14}$/cm$^2$ by exposure to species which include, but are not limited to Nitrogen Oxide (NO$_2$) and ozone (O$_3$). Alternatively, the charge density can be increased to any other pre-determined value. In preferred aspects, the charge can be supplied by the dielectric material.

Suitable dielectric materials can have a valence band offset in order to form a barrier to holes, or holes and electrons, at the diamond-dielectric interface. FIG. 4 shows a graph depicting the energy band offset of different materials with respect to diamond from S. Yamasaki, et al. "Doping and interface of homoepitaxial diamond for electronic applications," MRS Bull., vol. 39, no. 6, pp. 499-503, Jun. 2014, which is hereby incorporated by reference herein in its entirety.

The gate 309 can be positioned above the channel. In preferred aspects, the flow of holes through the aperture region 306 can be modulated by the gate 309.

The gate 309 can comprise a gate material. In certain aspects, any material that functions as a gate is suitable for use in the present invention as a gate material. The gate material can preferably be an electrical conductor. Examples of suitable gate materials include, but are not limited to, a metal (e.g., aluminum, nickel, lead, zirconium, etc.), a refractory metal (e.g., molybdenum, tungsten, etc.), a metal-containing compound, and the like.

The gate 309 can have a portion overlapping with the aperture length ($L_{ap}$) and a non-overlapping portion of the gate length ($L_{go}$) as shown in FIGS. 3B-3C.

The gate 309 can be placed on top of the aperture 306, which may have an aperture length ranging from about 0.01 micrometers (μm) to about 30 μm. Alternatively, the aperture length can be within any predetermined range. The gate 309 can have a full gate length ranging from about 0.02 μm to about 50 μm. Alternatively, the gate length can be within any predetermined range.

The source 310 can be coupled to the 2DHG layer 308. In preferred aspects, the source can be coupled to the 2DHG layer 308.

A source can comprise a source contact material. In certain aspects, any material that functions as a source contact is suitable for use in the present invention as a source contact material. The source contact material can preferably be an electrical conductor. Examples of suitable source contact materials include, but are not limited to, titanium, platinum, gold, molybdenum, graphite, palladium, doped c-BN, and polycrystalline or implanted regions of diamond.

The device 301A or diamond vertical transistor 301 can further comprise a drain contact coupled to the drain 303, a gate contact coupled to the gate 309, a source contact coupled to the source 310, or a combination thereof.

The drain contact can comprise a drain contact material. The gate contact can comprise a gate contact material. The source contact can comprise a source contact material. The drain contact material, gate contact material, or source contact material can preferably be an electrical conductor. Examples of suitable drain, gate, or source contact materials include, but are not limited to, a metal (e.g., titanium, zirconium, palladium, platinum, gold, aluminum, molybdenum, etc.), graphite, doped c-BN, doped polycrystalline diamond, implanted regions of diamond, and the like, or combinations thereof.

The device 301A and diamond vertical transistors 301 of the present invention can comprise a dielectric layer 311 as shown in FIGS. 3B-3C adapted and positioned to provide electrical insulation between one or more of the gate 309, the 2DHG layer 308, the CBL 305, and the drift layer 304.

In certain aspects, the device 301A or diamond vertical transistor 301 can be an enhancement mode (i.e., normally OFF) or a depletion mode (i.e., normally ON) device or transistor. A normally OFF mode is when no drain current flows and the gate 309 is not biased. A normally OFF operation can simplify the circuit design, for example, in the invertor circuit of automobiles, and can help simplify the needed mounting technologies.

Semiconductor structures 300, devices 301A, and diamond current aperture vertical transistors 301 configured in accordance with the subject matter described herein can have a height in the vertical direction ranging from about 55 μm to about 2.0 mm. Alternatively, semiconductor structures 300, devices 301A, and diamond current aperture vertical transistors 301 configured in accordance with the subject matter described herein can have a height in the vertical direction within a different range. Semiconductor structures 300, devices 301A, and diamond current aperture vertical transistors 301 configured in accordance with the subject matter described herein can have a length in a direction perpendicular to the vertical direction ranging from about 10.0 μm to about 100.0 μm. Alternatively, semiconductor structures 300, devices 301A, and diamond current aperture vertical transistors 301 configured in accordance with the subject matter described herein can have a length in a direction perpendicular to the vertical direction within a different range. In certain aspects, the semiconductor structures 300, devices 301A, and diamond current aperture vertical transistors 301 configured in accordance with the subject matter described herein can be scaled to create a multiplexed system (for example, in a multiple finger geometry) having larger physical dimensions in a direction perpendicular to the vertical direction. In such aspects, the multiplexed system can have a length in a direction perpendicular to the vertical direction of up to about 10.0 mm. Alternatively, the multiplexed system can have a length in a direction perpendicular to the vertical direction of any other specified length.

In certain aspects, devices 301A, and diamond current aperture vertical transistors 301 configured in accordance with the subject matter described herein can have an On/Off current ratio ranging from about $10^3$ to about $10^{10}$. Alternatively, the On/Off current ratio can be within a different range.

Devices 301A, and diamond current aperture vertical transistors 301 configured in accordance with the subject matter described herein can have improved breakdown voltage and high temperature/radiation environment operational capability when compared with conventional devices and transistors.

A person having ordinary skill in the art should appreciate that a threshold voltage can be determined using techniques known in the art. The threshold voltage can vary based on the thickness and composition of the layers of devices 301A, and diamond current aperture vertical transistors 301 configured in accordance with the subject matter described herein. Devices 301A, and diamond current aperture vertical transistors 301 configured in accordance with the subject matter described herein can have a threshold voltage ($V_t$) of at least about 0.001 mV. Alternatively, the present invention can have any value of $V_t$.

This disclosure also provides methods of making a semiconductor structure 300, device 301A, or diamond current aperture vertical transistor 301A. The methods can comprise one or more of the following steps.

Figure 11:
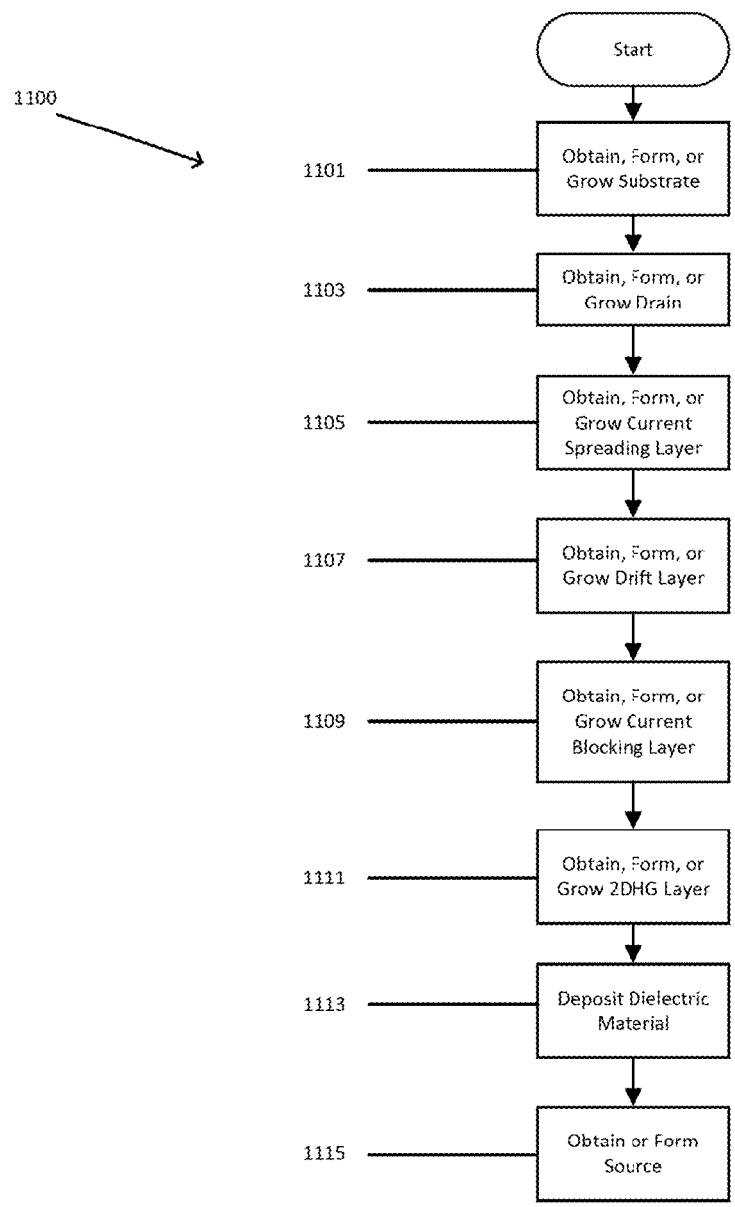
FIG. 11 shows a non-limiting flowchart of a method for creating a diamond based current aperture vertical transistor.

Referring to FIG. 11, the present disclosure provides a method 1100 of making a semiconductor structure 300, device 301A, or diamond current aperture vertical transistor 301. At process block 1101, the method 1100 can include obtaining, forming, or growing a substrate. At process block 1103, the method 1100 can include obtaining, forming, or growing a drain. At process block 1105, the method 1100 can include obtaining, forming, or growing a current spreading layer. At process block 1107, the method 1100 can include obtaining forming, or growing a drift layer. At process block 1109, the method 1100 can include obtaining, forming, or growing a CBL. At process block 1111, the method 1100 can include obtaining, forming, or growing a 2DHG layer. At process block 1113, the method 1100 can include depositing dielectric material. At process block 1115, the method 1100 can include obtaining or forming a source.

In certain aspects, the methods can comprise growing or forming a drain coupled to the substrate and disposed adjacent to the substrate in the vertical direction. In certain aspects, the methods can comprise growing or forming a substrate coupled to the drain and disposed adjacent to the substrate in the vertical direction.

In aspects where the current spreading layer is grown or formed, the methods can comprise growing or forming a current spreading layer coupled to the drain or substrate and disposed adjacent to the drain or substrate in the vertical direction.

In aspects where the drift layer is grown or formed, the methods can comprise growing or forming a drift layer coupled to the current spreading layer and disposed adjacent to the current spreading layer in the vertical direction.

In aspects where the CBL is grown or formed, the methods can comprise growing or forming the CBL coupled to the drift layer and disposed adjacent to the drift layer in the vertical direction.

In aspects where the 2DHG-containing layer is grown or formed, the methods can comprise growing or forming the 2DHG-containing layer coupled to the p– layer and disposed adjacent to it in the vertical direction.

The methods can comprise depositing a dielectric material on the top surface of the 2DHG on which the gate electrode is formed.

The methods can comprise growing or forming a source coupled to the 2DHG layer, and optionally coupled to the 2DHG.

Obtaining, growing or forming can comprise microwave plasma chemical vapor deposition (MPCVD), ion implantation, diffusion, or combinations thereof. Obtaining can further comprise simply acquiring the target of the obtaining step. An example of obtaining includes, but is not limited to, purchasing from a vendor.

In certain aspects, the method does not include a regrowth step.

In certain aspects, the devices can be isolated from each other using a partial mesa etch by etching and stopping within the drift region using inductively coupled plasma (ICP), reactive-ion etching (RIE) etching methods, or the like. In certain aspects, isolation can be achieved either by exposure to a UV-ozone atmosphere or chemical treatment which renders the diamond surface non-conducting by oxygen (O)-terminating it. In certain aspects, the devices can be isolated by ion implantation which can destroy the crystal structure in the isolated regions rendering it isolating. In such aspects, the electric field peak associated with sharp edges that may be caused by conventional mesa isolation using RIE and ICP etching can be avoided.

In certain aspects, devices 301A, and diamond current aperture vertical transistors 301 configured in accordance with the subject matter described herein can be passivated using a suitable dielectric or passivation layer. Suitable passivation layers can include but are not limited to $SiO_2$, AlN, $LaAl_2O_3$, and $Al_2O_3$. FIG. 4 shows a set of materials which can be chosen as a dielectric depending on their valence band offset.

Figure 8A:
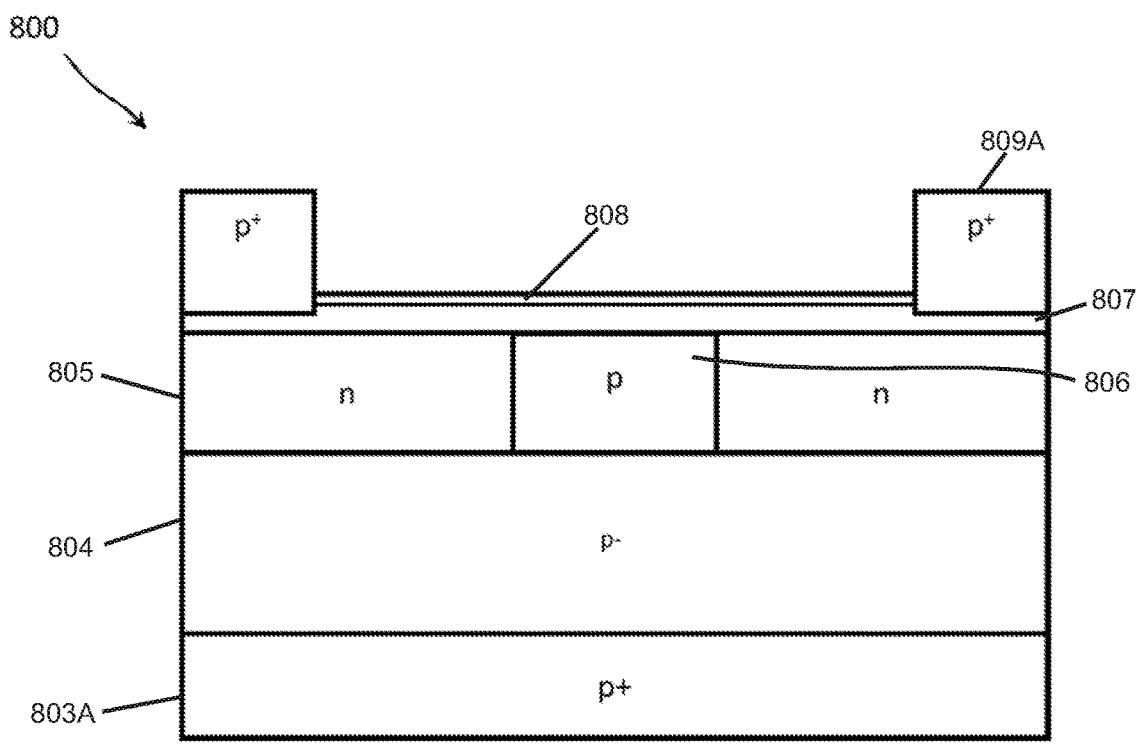
FIG. 8A is a non-limiting aspect of a semiconductor structure for a diamond based current aperture vertical transistor using a boron doped p-type delta doped channel.
Figure 8B:
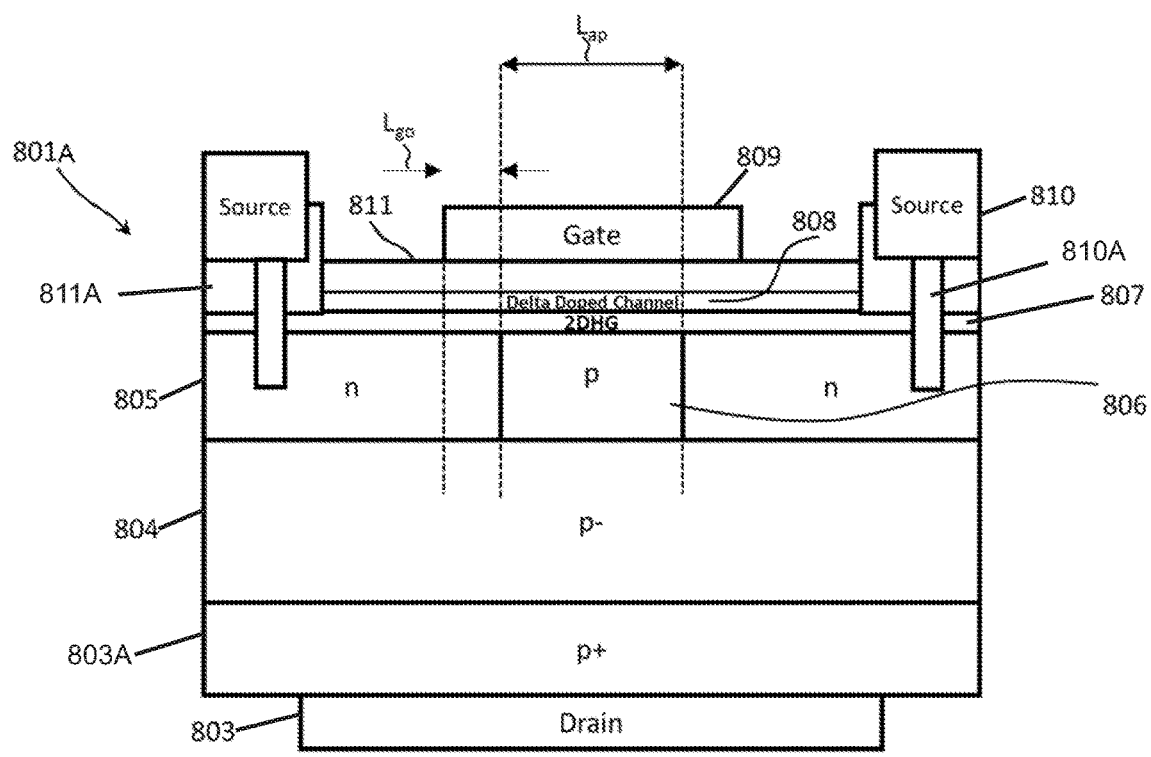
FIG. 8B is a non-limiting aspect of a device structure for a diamond based current aperture vertical transistor without a separate substrate with a delta doped boron doped p-type channel.
Figure 8C:
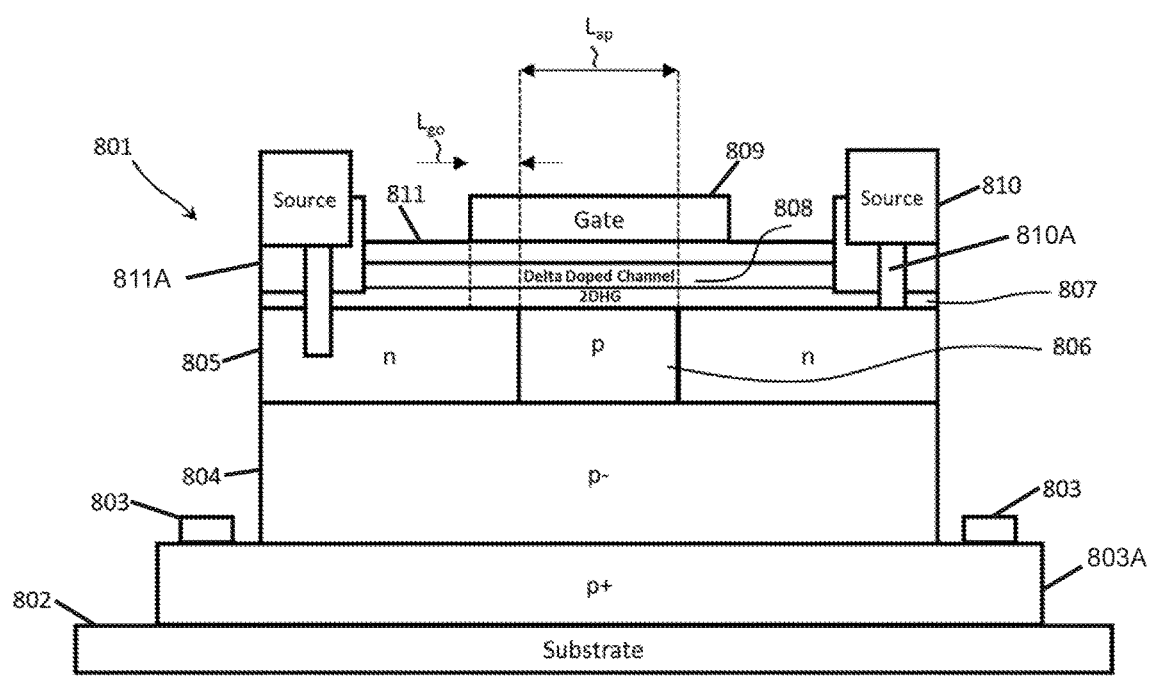
FIG. 8C is a non-limiting aspect of a device structure for a diamond based current aperture vertical transistor with a substrate with a delta doped boron doped p-type channel.

Referring to FIGS. 8A-8C, in certain aspects, a semiconductor structure 800, a device 801A, or a diamond current aperture vertical transistor 801 of the present disclosure can comprise one or more of the following: a substrate 802, a drain 803, a current spreading layer 803A, a drift layer 804, a current blocking layer (CBL) 805, an aperture 806, a 2DGH layer 807, a p-type delta doped channel 808, a gate 809, vias 810A, an insulating layer 811A, and a source 810. The gate 809 can have a portion overlapping with the aperture length (Lap) and a non-overlapping portion of the gate length (Lgo) as shown in FIGS. 8B-8C.

The devices 801A, and the diamond current aperture vertical transistors 801 configured in accordance with the subject matter described herein can comprise a dielectric layer 811 as shown in FIGS. 8B-8C. The dielectric layer 811 can be adapted and positioned to provide electrical insulation between one or more of the gate 809, the p-type delta doped channel 808, and the 2DHG layer 807, the CBL 805, and the drift layer 804.

Figure 9A:
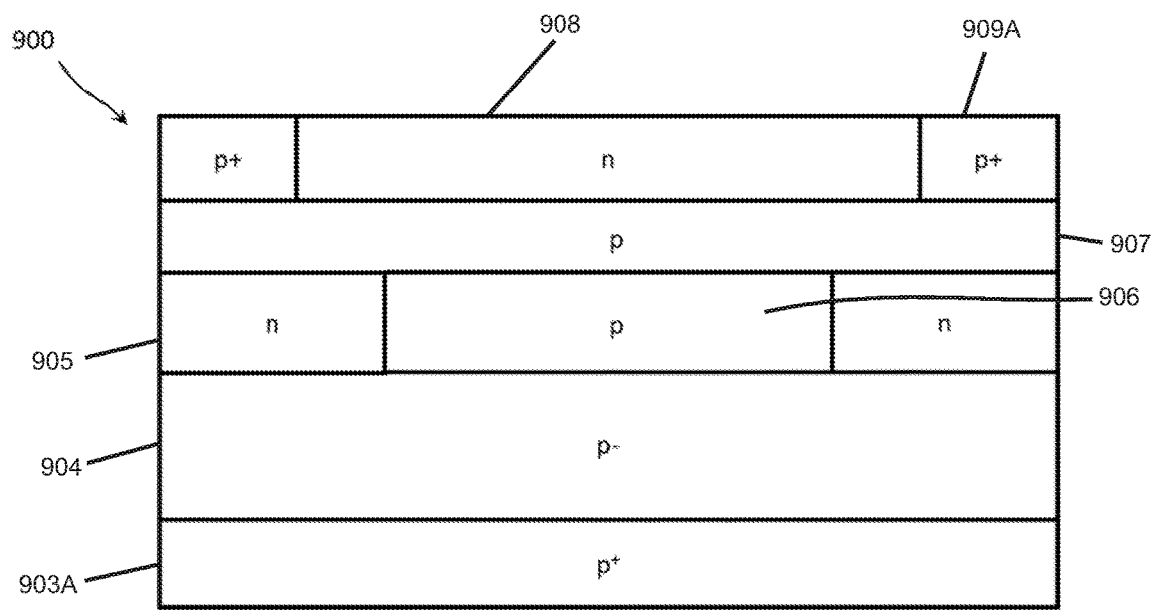
FIG. 9A is a non-limiting aspect of a semiconductor structure for a diamond based current aperture vertical transistor using a Junction Field Effect Transistor Approach with a p-type channel.
Figure 9B:
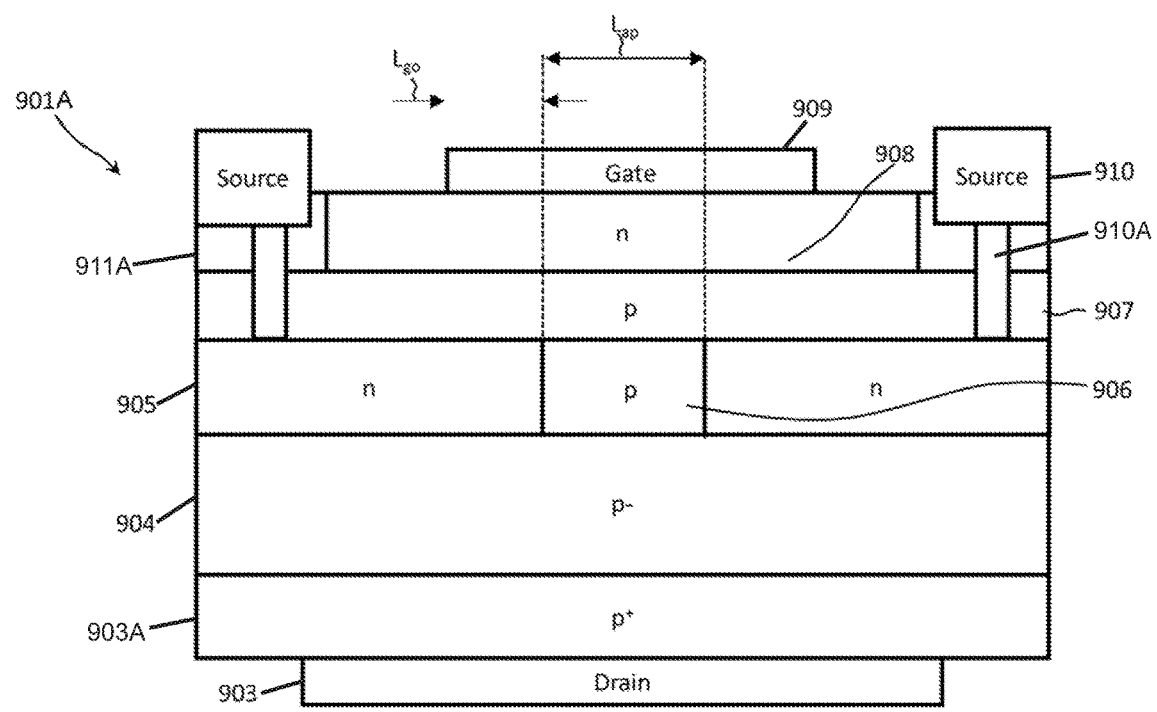
FIG. 9B is a non-limiting aspect of a device structure for a diamond based current aperture vertical transistor without a separate substrate with a delta doped boron doped p-type channel.
Figure 9C:
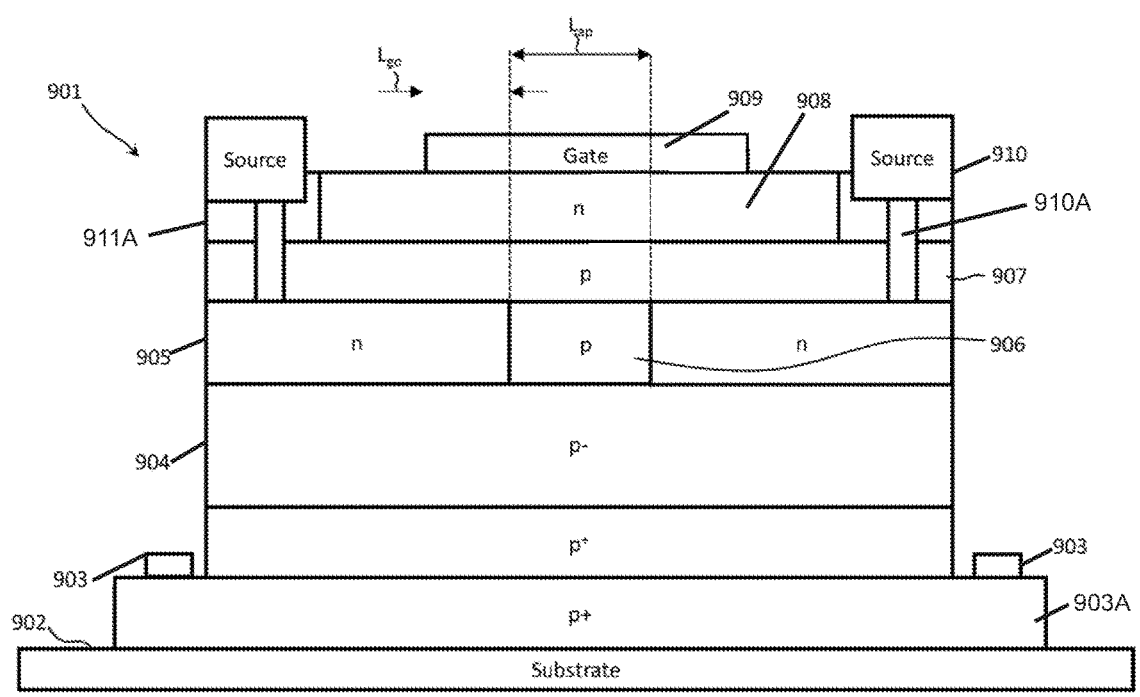
FIG. 9C is a non-limiting aspect of a device structure for a diamond based current aperture vertical transistor with a substrate using a Junction Field Effect Transistor Approach with a p-type channel.

Referring to FIGS. 9A-9C, in certain aspects, a semiconductor structure 900, a device 901A, or a diamond current aperture vertical transistor 901 of the present disclosure can comprise one or more of the following: a substrate 902, a drain 903, a current spreading layer 903A, a drift layer 904, a current blocking layer (CBL) 905, an aperture 906, a p-type channel layer 907, an n-type diamond gate-adjacent layer 908, a gate 909, vias 910A, an insulating layer 911A, and a source 910. The gate 909 can have a portion overlapping with the aperture length (Lap) and a non-overlapping portion of the gate length (Lgo) as shown in FIGS. 8B-8C.

An n-type channel configuration can also be realized by appropriately reversing the doping to a donor type, such as P or N.

Figure 10:
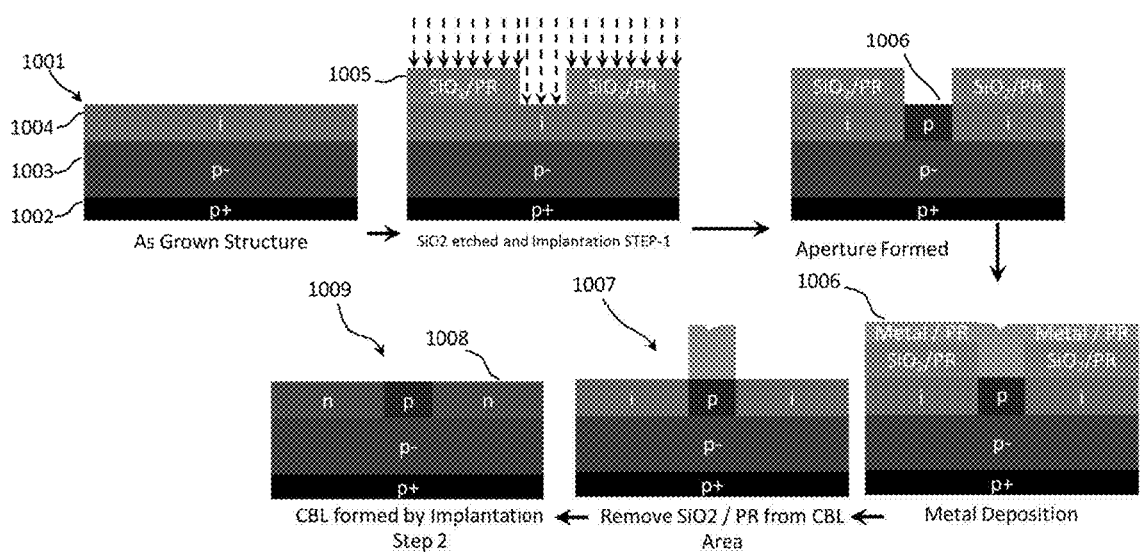
FIG. 10 shows a process flow for planar CBL and aperture.

Referring to FIG. 10, in certain aspects, it can be beneficial to form the structure for the fabrication of the transistor by using an as-grown structure 1001, consisting of a drain 1002, a drift region 1003, and an intrinsic or nominally doped diamond or c-BN layer 1004 is considered. A photoresist layer or hard mask 1005 can be comprised of, but is not limited to, $SiO_2$, SiNx, a metal or the like, and can be deposited on the structure 1001. The photoresist layer or hard mask 1005 can be etched off in the region where the aperture is to be formed and an aperture 1006 can be formed by ion implantation with Boron or a species which can dope diamond p-type. A blanket metal or photoresist deposition can be performed on the whole structure, before the $SiO_2$ is removed using appropriate chemicals such as Hydrofluoric Acid, Buffered Oxide Etch, or a species which does not etch the metal to form a structure 1007. In case of a photoresist mask, an oxygen plasma can be used. A CBL 1008 can be formed using ion implantation using phosphorus, arsenic, or any species which dopes the diamond n-type. The metal can be etched off in a suitable etchant. The channel and source can be formed using methods described earlier to form the structure 1009 for fabrication of the transistor.

The present disclosure can be further understood by way of the following non-limiting examples.

EXAMPLES

Example 1. Diamond Current Aperture Vertical Transistor with Epitaxially Grown Doped Diamond Current Block Layer In this particular aspect, the CBL can be grown epitaxially adjacent to the drift layer, and in a direction vertical to that of the drift layer, using MPCVD. The aperture can be formed by etching off the CBL and regrowth. The channel can then be grown on top of aperture in the vertical direction, and can be formed after hydrogen terminating the grown layer which may or may not be doped. The 2DHG can be formed after exposure to certain species such as, but not limited to, atmospheric air, $NO_2$, and Ozone. In such aspects, the charge density in the 2DHG layer can be >1E11/cm$^2$.

Two terminal tests were performed to test the blocking capability of these structures. The CBL in combination with the drift layer and drain can function like a diode. In certain aspects, the doping in the CBL region can range from about $5E17$-$5E20/cm^3$, $1E13$-$1E16/cm^3$ in the drift region and $5E17$-$5E21/cm^3$ in the drain region.

In certain aspects, the structure can be grown on a non-conducting type IIa single crystal diamond substrate. A hard mask consisting of $SiO_2$ can be deposited using plasma enhanced chemical vapor deposition, patterned using standard photolithography and etched in a RIE system. In certain aspects, the hard mask can be deposited by placing the diamond sample in a recess in a carrier wafer to obtain uniform film thickness. In aspects where etches >500 nm are needed, the etch can be performed in steps of 15 mins and the RIE system can be purged between etching with nitrogen to bring it near atmospheric pressure before stopping and letting the photoresist cool in order to prevent carbonization of the photoresist. After the hard mask etch, the photoresist can be removed using photoresist stripper or solvent and the diamond can be etched in an oxygen plasma with 38 standard cubic centimeters per minute (sccm) Oxygen and 2 sccm of $SF_6$ at 7 millitorr (mT) process pressure and 30 mT strike pressure. The diamond can have a selectivity of ~5:3 with respect to $SiO_2$. In certain aspects, a common contact to the drain can be used. In certain aspects, the substrate can be a type IIb Boron doped p-type substrate. The inset of FIG. 5 shows that a turn-on voltage of ~4.5-5V was measured in structures fabricated on a (100)-type IIa substrate, and the forward current density was measured to be ~20 $A/cm^2$ at 20 V.

Figure 5:
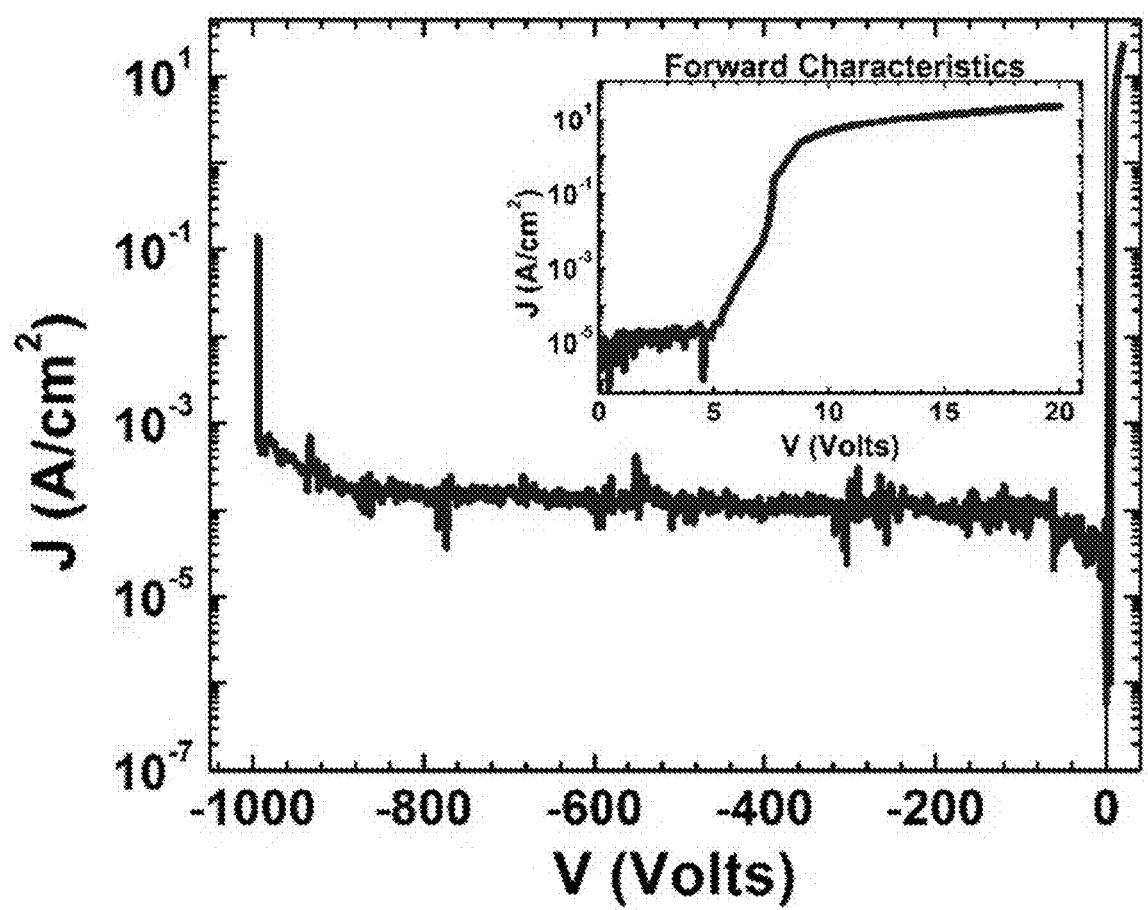
FIG. 5 shows the current density vs voltage characteristics of a diamond n-i-p diode fabricated on (100)-oriented type IIa bulk diamond substrate.

FIG. 5 shows the diode characteristics where a breakdown voltage of ~994 V at a current level of ~1E-3 $A/cm^2$ was measured. The measurements were performed using a Keithley 2410 Sourcemeter (available commercially from Tektronix, of Beaverton, Oreg.) having a least count of 1 nA. The device showing the characteristics shown in FIGS. 5-6 was a circular diode 30 microns in diameter.

Figure 6:
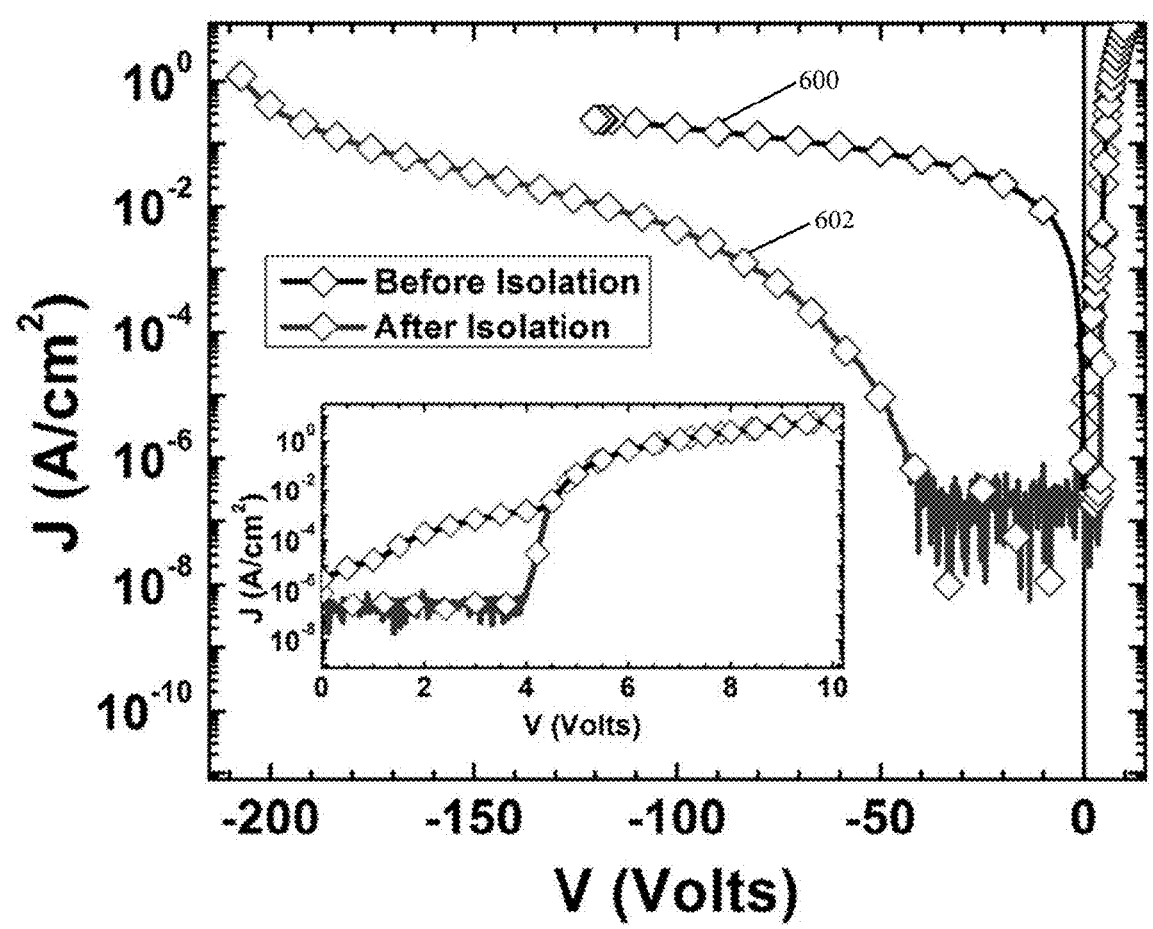
FIG. 6 shows the current density vs voltage characteristics of a diamond n-i-p diode fabricated on (111)-oriented type IIb p-type bulk diamond substrate before and after isolation.

In preferred aspects, a mesa etch is performed to isolate each device by etching down from the top active layer in the vertical direction and stopping in the drift region. This method reduces the leakage current considerably as shown in FIG. 6 for the case of PIN structures grown on (111)-oriented type IIb substrates using MPCVD.

Figure 7:
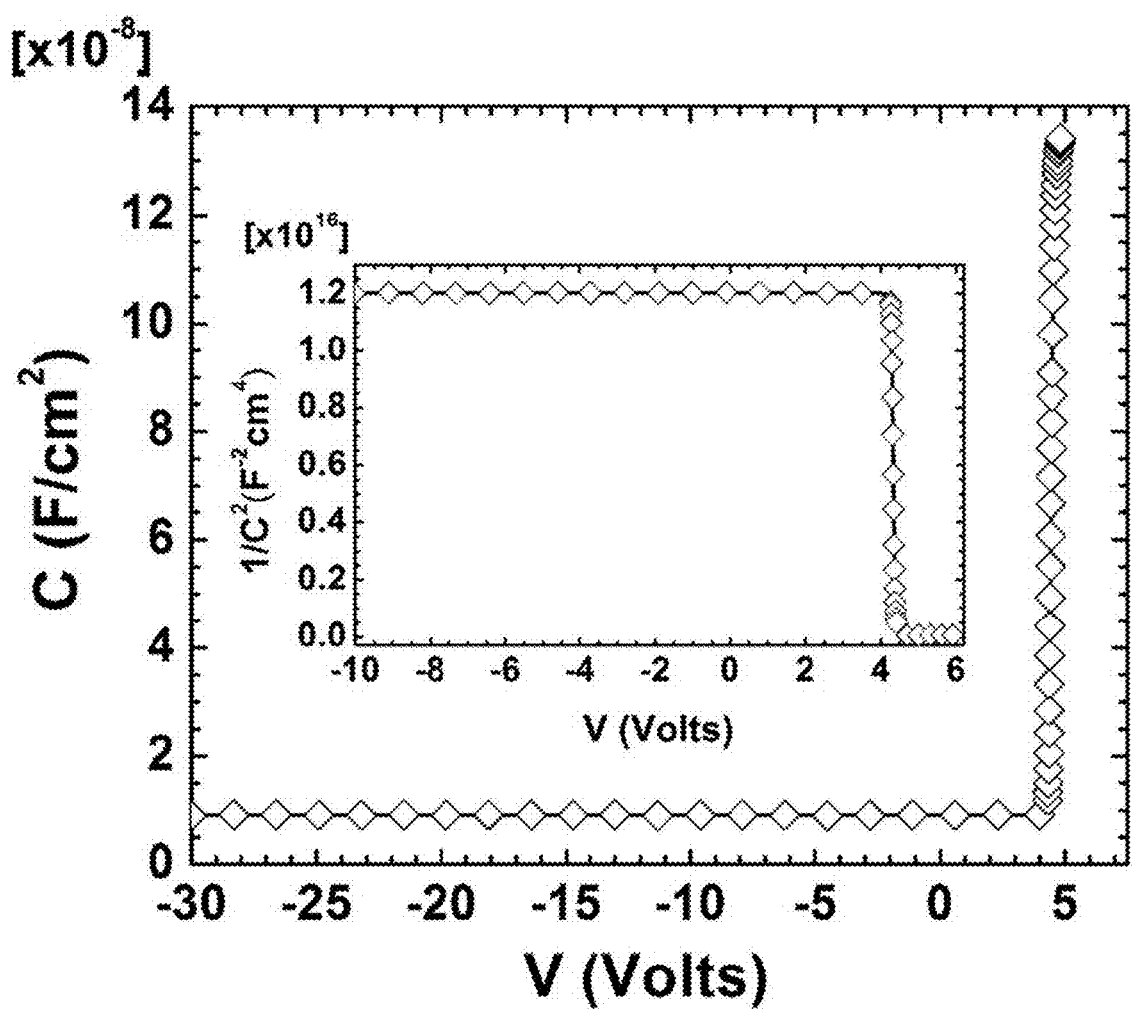
FIG. 7 shows the capacitance vs voltage and $1/C^2$ vs V characteristics of a diamond n-i-p diode fabricated on (111)-oriented type IIb p-type bulk diamond substrate after isolation at 30 KHz frequency and 30 mV rms voltage.

FIG. 7 shows the Capacitance (C) vs Voltage (V) and $1/C^2$ vs V characteristics of diodes fabricated on (111)-oriented type IIb diamond substrates with a 30 kilohertz (kHz) AC signal and 30-50 mV AC root mean square (rms) voltage. The built-in voltage of these diodes fabricated on (111)-oriented diamond substrates obtained from the $1/C^2$ vs V characteristics was ~4.3 V, which is close to the observed turn-on voltage in FIG. 7. The carrier concentration in the space charge region was calculated to be ~$6E14/cm^3$. The thickness of the drift region was calculated to be ~530 nm. The blocking voltage at a current level of 1 $A/cm^2$ was ~207 V corresponding to a breakdown field of ~3.9 MV/cm, which is greater than the theoretically predicted breakdown field of both SiC and GaN. A person having ordinary skill in the art should appreciate that the functionality of the device used to generate the values shown in FIG. 7 was achieved by growing high quality doped diamond thin films devoid of major defects, and not by implantation. The breakdown field in this example is expected to be close to the values demonstrated by the CBL described herein. In any case, such devices require an aperture through which the current can flow. FIGS. 6 and 7 also appeared in M. Dutta, et al., "High Voltage Diodes in Diamond Using (100)- and (111)-Substrates," in IEEE Electron Device Letters, vol. 38, no. 5, pp. 600-603, May 2017, which is hereby incorporated by reference herein in its entirety.

Example 2. Diamond Current Aperture Vertical Transistor with Implanted CBL or Aperture In this particular aspect, the CBL and the aperture of the diamond current aperture vertical transistor can be formed using implantation. A layer of photoresist, dielectric, metal, or the like, can be used to pattern the region being implanted and also shift the peak of the doping profile to be near the surface. The layer can be removed by appropriate chemical treatment after implantation like, but not limited to, treatment with a heated acid solution of nitric acid, perchloric acid, and sulfuric acid. In certain aspects, the CBL can be formed by damage where the CBL region is rendered insulating. In preferred aspects, a series of implant steps can be used to obtain a more uniform distribution.

Example 3. Diamond Current Aperture Vertical Transistor with Heterojunction

In this particular aspect, a heterojunction of AlN or a wide bandgap material like, but not limited to, BN and diamond can be used to form the p-type channel instead of p- or undoped diamond. Referring to FIGS. 3B-3C, the p-diamond layer 307 can be formed using the wider bandgap material like AlN or BN. Holes can be accumulated in the diamond to form the p-type channel. The surface of the diamond can be either oxygen terminated or hydrogen terminated.

Example 4. Diamond Current Aperture Vertical Transistor with Delta Doped Channel In this particular aspect, a delta doped channel can be formed by a Boron-doped layer grown using MPCVD. To achieve effective charge modulation, sheet charge density can be <$10^{13}/cm^3$ for which a boron doping of >$10^{20}/cm^3$ is required with a thickness of the order of 1 nm. Compensation doping using implantation may be required to achieve the 1 nm delta doped profile. Compensation species can include but are not limited to Nitrogen, Phosphorus, Arsenic, Sulphur, and the like. The resulting transistor can have a structure that is substantially similar to that shown in FIGS. 8A-8C.

Example 5. Diamond Current Aperture Vertical Transistor Using JFET Approach

In this particular aspect, a diamond current aperture vertical transistor can be fabricated using a JFET configuration. A lightly p-type channel can be sandwiched between an $n^+$ layer on which the gate is to be fabricated. Source and drain ohmic contacts can then be formed using heavily doped p+ contacts below them. The resulting transistor can have a structure that is substantially similar to that shown in FIGS. 9A-9C.

Example 6. Diamond Current Aperture Vertical Transistor Using Heteroepitaxially Grown CBL In this particular aspect, the CBL can be formed by a wider bandgap material which offers a barrier to the flow of carriers. The CBL can be either grown and the region of the aperture can be etched and regrown, or likewise the aperture can be grown and the CBL region can be etched and regrown, using the wider bandgap material. The wider bandgap material can have a bandgap offset with diamond allowing it to block either electrons or holes depending on conduction or valence band offset, respectively.

FIG. 4 shows the bandgap offset of different materials with respect to diamond. c-BN in particular offers a particular advantage of being lattice matched to diamond, which would enable growing the channel layer on top epitaxially.

Each of the following patent applications, which generally relate to the manufacture and/or use of semiconductor devices, is hereby incorporated by reference herein in its entirety: Koeck et al. U.S. Patent Application Publication No. 2017/0330746; Chowdhury et al. U.S. Patent Application Publication No. 2015/137137; and Chowdhury et al. U.S. Patent Application Publication No. 2012/0319127.

For the avoidance of doubt, aspects of the present disclosure described with respect to the systems are applicable to the methods, and aspects described with respect to the methods are applicable to the systems.

It will be appreciated by those skilled in the art that while the invention has been described above in connection with particular embodiments/aspects and examples, the invention is not necessarily so limited, and that numerous other embodiments, examples, uses, modifications and departures from the embodiments, examples and uses are intended to be encompassed by the claims attached hereto.

The invention claimed is:

1. A vertical field effect transistor comprising:
a drain;
a drift layer disposed in a first direction relative to the drain and in electronic communication with the drain;
a current blocking layer disposed in the first direction relative to the drift layer and in electronic communication with the drain, the current blocking layer comprising a barrier material region and an aperture region;
a two-dimensional hole gas-containing layer disposed in the first direction relative to the current blocking layer;
a gate electrode oriented to alter an energy level of the aperture region when a gate voltage is applied to the gate electrode; and
a source in ohmic contact with the two-dimensional hole gas-containing layer;
wherein at least one of the drain, the drift layer, and the two-dimensional hole gas-containing layer comprises diamond; and
wherein the barrier material region comprises insulating diamond material, and the aperture region comprises conductive diamond material.

2. The vertical field effect transistor of claim 1, wherein at least one of the barrier material region and the aperture region is formed by doping, implantation, regrowth, or heteroepitaxy.

3. The vertical field effect transistor of claim 1, further comprising a p-type delta doped channel disposed between the gate electrode and the two-dimensional hole gas-containing layer.

4. The vertical field effect transistor of claim 1, wherein the insulating diamond material of the barrier material region is rendered insulating by exposure to ultraviolet-ozone or oxygen plasma.

5. The vertical field effect transistor of claim 1, wherein the insulating diamond material of the barrier material region contains activated oxygen.

6. The vertical field effect transistor of claim 1, wherein the two-dimensional hole gas-containing layer comprises hydrogen-terminated diamond.

7. The vertical field effect transistor of claim 1, further comprising a dielectric layer positioned to provide electrical insulation between the gate electrode and the two-dimensional hole gas-containing layer.

8. The vertical field effect transistor of claim 1, further comprising a substrate layer, wherein the drift layer is disposed in the first direction relative to the substrate layer.

9. The vertical field effect transistor of claim 8, wherein the substrate layer comprises a non-conducting type IIa single crystal diamond substrate layer.

10. The vertical field effect transistor of claim 8, further comprising a current spreading layer arranged between the drift layer and the substrate.

11. The vertical field effect transistor of claim 10, wherein the drain comprises at least one drain contact formed on the current spreading layer.

12. The vertical field effect transistor of claim 11, wherein at least a portion of the current spreading layer is wider than the drift layer, and the least one drain contact is spaced apart from the drift layer.

13. The vertical field effect transistor of claim 1, wherein at least two of the drain, the drift layer, and the two-dimensional hole gas-containing layer comprises diamond.

14. The vertical field effect transistor of claim 1, wherein each of the drain, the drift layer, and the two-dimensional hole gas-containing layer comprises diamond.

* * * * *